(12) United States Patent
Liao et al.

(10) Patent No.: US 12,211,790 B2
(45) Date of Patent: *Jan. 28, 2025

(54) CONDUCTIVE RAIL STRUCTURE FOR SEMICONDUCTOR DEVICES

(71) Applicant: Taiwan Semiconductor Manufacturing Co., Ltd., Hsinchu (TW)

(72) Inventors: Yi-Bo Liao, Hsinchu (TW); Wei Ju Lee, Hsinchu (TW); Cheng-Ting Chung, Hsinchu (TW); Hou-Yu Chen, Zhubei (TW); Chun-Fu Cheng, Zhubei (TW); Kuan-Lun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/447,664

(22) Filed: Aug. 10, 2023

(65) Prior Publication Data

US 2023/0387001 A1    Nov. 30, 2023

Related U.S. Application Data

(60) Continuation of application No. 17/723,116, filed on Apr. 18, 2022, now Pat. No. 11,837,538, which is a division of application No. 16/832,833, filed on Mar. 27, 2020, now Pat. No. 11,309,240.

(60) Provisional application No. 62/928,796, filed on Oct. 31, 2019.

(51) Int. Cl.
*H01L 23/522* (2006.01)
*H01L 21/8234* (2006.01)
*H01L 29/66* (2006.01)
*H01L 29/78* (2006.01)

(52) U.S. Cl.
CPC .. *H01L 23/5226* (2013.01); *H01L 21/823431* (2013.01); *H01L 21/823475* (2013.01); *H01L 29/66795* (2013.01); *H01L 29/785* (2013.01)

(58) Field of Classification Search
CPC ......... H01L 23/5226; H01L 21/823431; H01L 21/823475; H01L 29/66795; H01L 29/785; H01L 21/743; H01L 21/76895; H01L 23/485; H01L 23/5286; H01L 23/535

See application file for complete search history.

(56) References Cited

U.S. PATENT DOCUMENTS

| 11,309,240 B2 * | 4/2022 | Liao ............... H01L 29/785 |
| 2016/0343708 A1 | 11/2016 | Park et al. |
| 2018/0374791 A1 | 12/2018 | Smith et al. |
| 2020/0006329 A1 | 1/2020 | Lilak et al. |

(Continued)

*Primary Examiner* — Changhyun Yi
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a first vertical structure and a second vertical structure formed over the substrate, and a conductive rail structure between the first and second vertical structures. A top surface of the conductive rail structure can be substantially coplanar with top surfaces of the first and the second vertical structures.

20 Claims, 20 Drawing Sheets

(56) References Cited

U.S. PATENT DOCUMENTS

2020/0373331 A1* 11/2020 Kim .................... H01L 27/1203
2021/0098306 A1 4/2021 Smith et al.

* cited by examiner

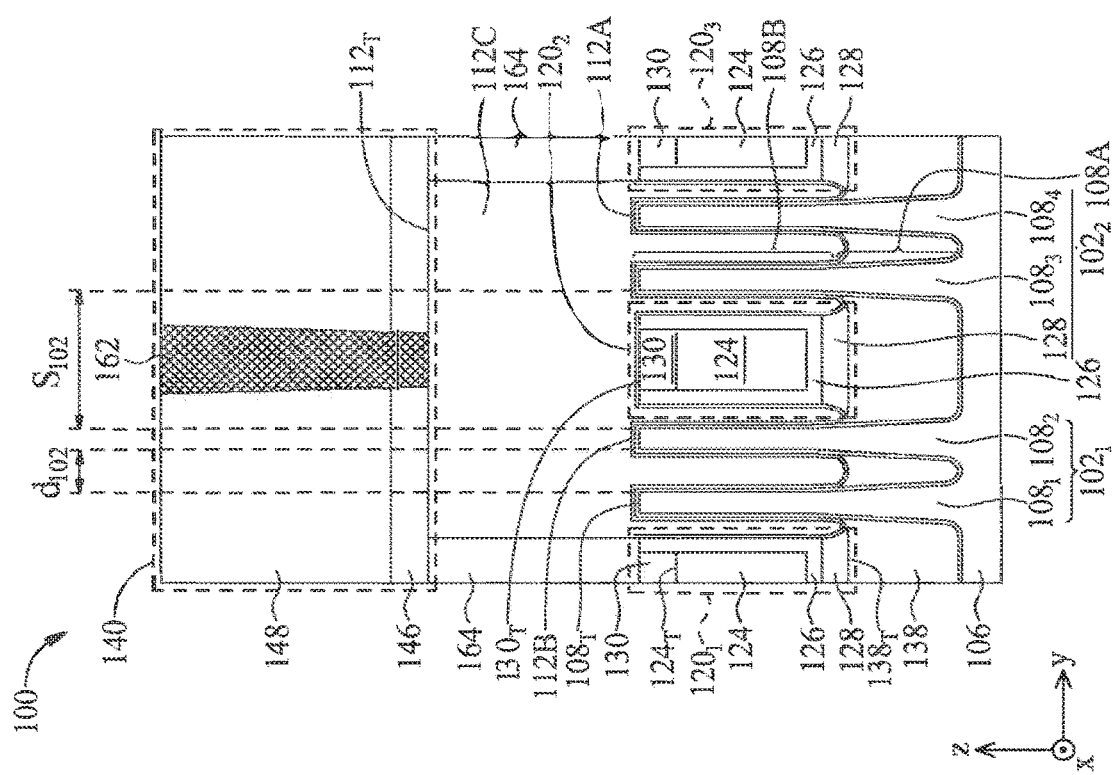
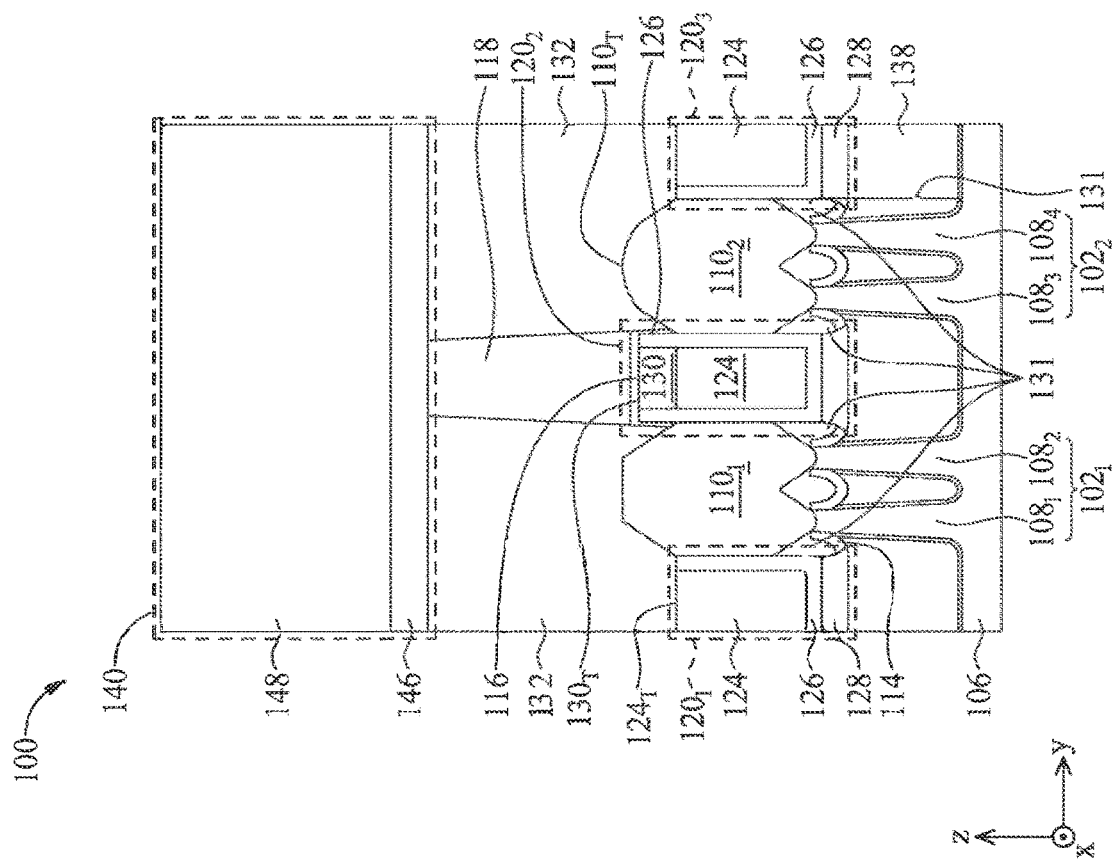
Fig. 1D
Fig. 1C

CONDUCTIVE RAIL STRUCTURE FOR SEMICONDUCTOR DEVICES

CROSS-REFERENCE TO RELATED APPLICATIONS

This application is a continuation application of U.S. Non-Provisional patent application Ser. No. 17/723,116, filed on Apr. 18, 2022, titled "Conductive Rail Structure for Semiconductor Devices," which is a divisional of U.S. Non-Provisional patent application Ser. No. 16/832,833, filed on Mar. 27, 2020, titled "Conductive Rail Structure for Semiconductor Devices," which claims the benefit of U.S. Provisional Patent Application No. 62/928,796, filed on Oct. 31, 2019, titled "Embedded Metal Structure for Semiconductor Device." The contents of the aforementioned applications are incorporated by reference herein in their entireties.

BACKGROUND

Advances in semiconductor technology have increased the demand for semiconductor devices with higher storage capacity, faster processing systems, higher performance, and lower costs. To meet these demands, the semiconductor industry continues to reduce layout area and increase transistor count in integrated circuits. Such compact integrated circuits increase complexity of interconnect routing for semiconductor devices.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1C and 1D illustrate cross-sectional views of a semiconductor device, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
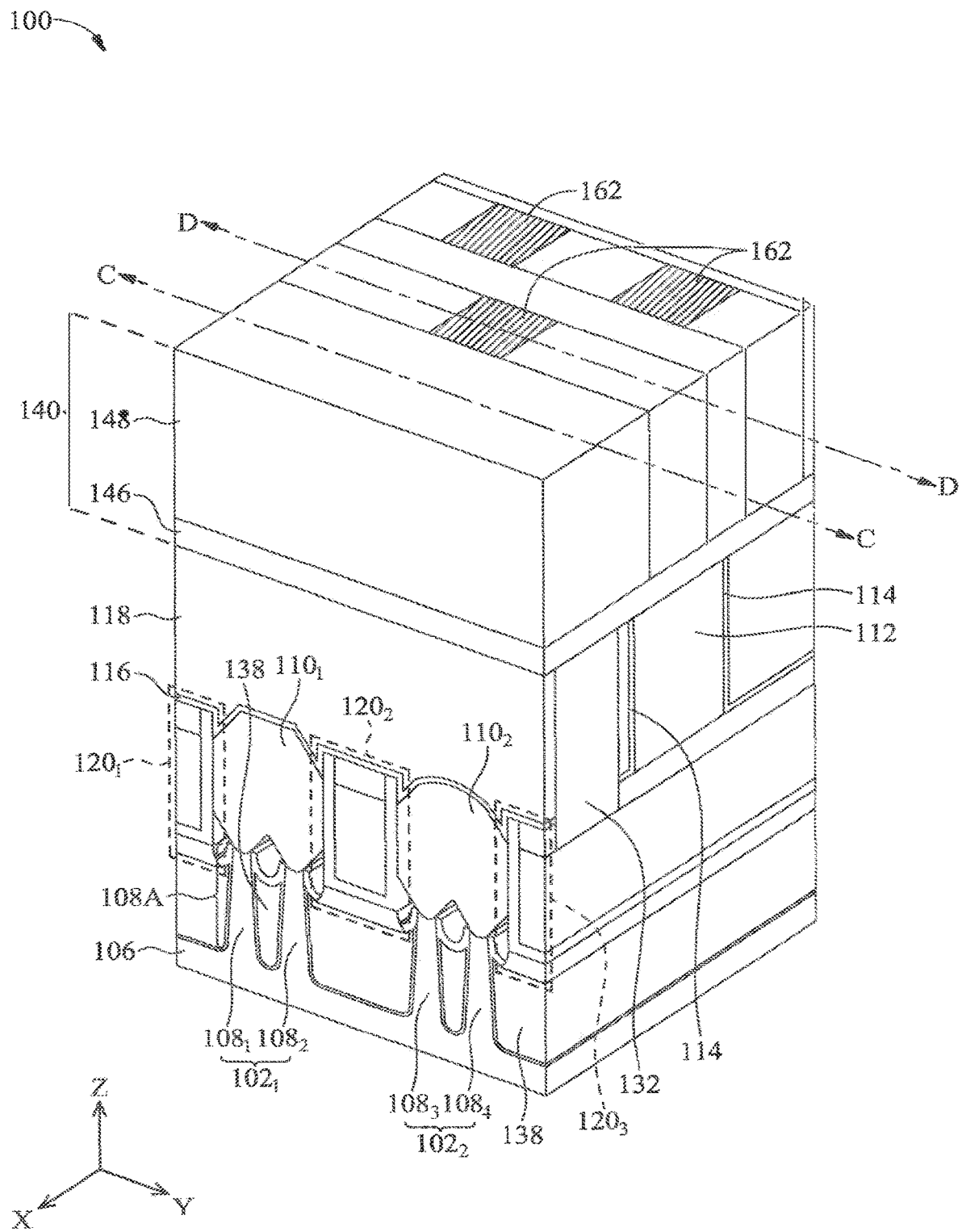
FIG. 1A illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

As used herein, the term "vertical" means nominally perpendicular to the surface of a substrate.

As used herein, the term "insulating layer" refers to a layer that functions as an electrical insulator (e.g., a dielectric layer).

As used herein, the term "selectivity" refers to the ratio of the etch rates of two materials under a same etching condition.

As used herein, the term "etching selectivity of a first layer to the second layer of N or greater" refers to an etching rate associated the first layer is at least N times greater than another etching rate associated with the second layer under a same etching condition.

As used herein, the term "high-k" refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

Fins associated with fin field effect transistors (finFETs) or gate-all-around (GAA) FETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Technology advances in the semiconductor industry drive the pursuit of integrated circuits (IC)s having higher device density, higher performance, and lower cost. In the course of the IC evolution, various three dimensional (3D) field-effect transistors (FETs), such as FinFET and GAA FETs, have been adopted to achieve small pitch size to reduce IC's area. But metal line routings for the FETs occupy a significant amount of IC area, especially the power rails that connect a power level (e.g., $V_{DD}$) and a ground level ($V_{SS}$) to the FETs. For example, power rails can occupy around 30% of area of most ICs. Accordingly, scaling the size of power rails is important to achieve compact ICs.

The present disclosure is directed to a fabrication method and a conductive rail structure that connect transistors within an IC to the power level or the ground level. The conductive rail can be formed laterally between two adjacent fin structures on a substrate. In other words, the conductive rail structure can be placed at the transistor level (e.g., under the interconnect level) of the IC to deliver power to the transistors. In some embodiments, a top surface of the conductive rail structure can be substantially coplanar with or below top surfaces of the two adjacent fin structures. In some embodiments, the conductive rail structure can include a layer of conductive material and a layer of insulating material that surrounds the layer of conductive material. In some embodiments, the conductive rail structure can be extended substantially parallel to the two adjacent fin structures. A benefit of the present disclosure, among others, is to utilize the conductive rail structure to perform power/ground routing at the transistor level of the IC, thus alleviating the metal line routing requirements at the interconnect level of the IC and accordingly reducing the IC's area.

Figure 1B:
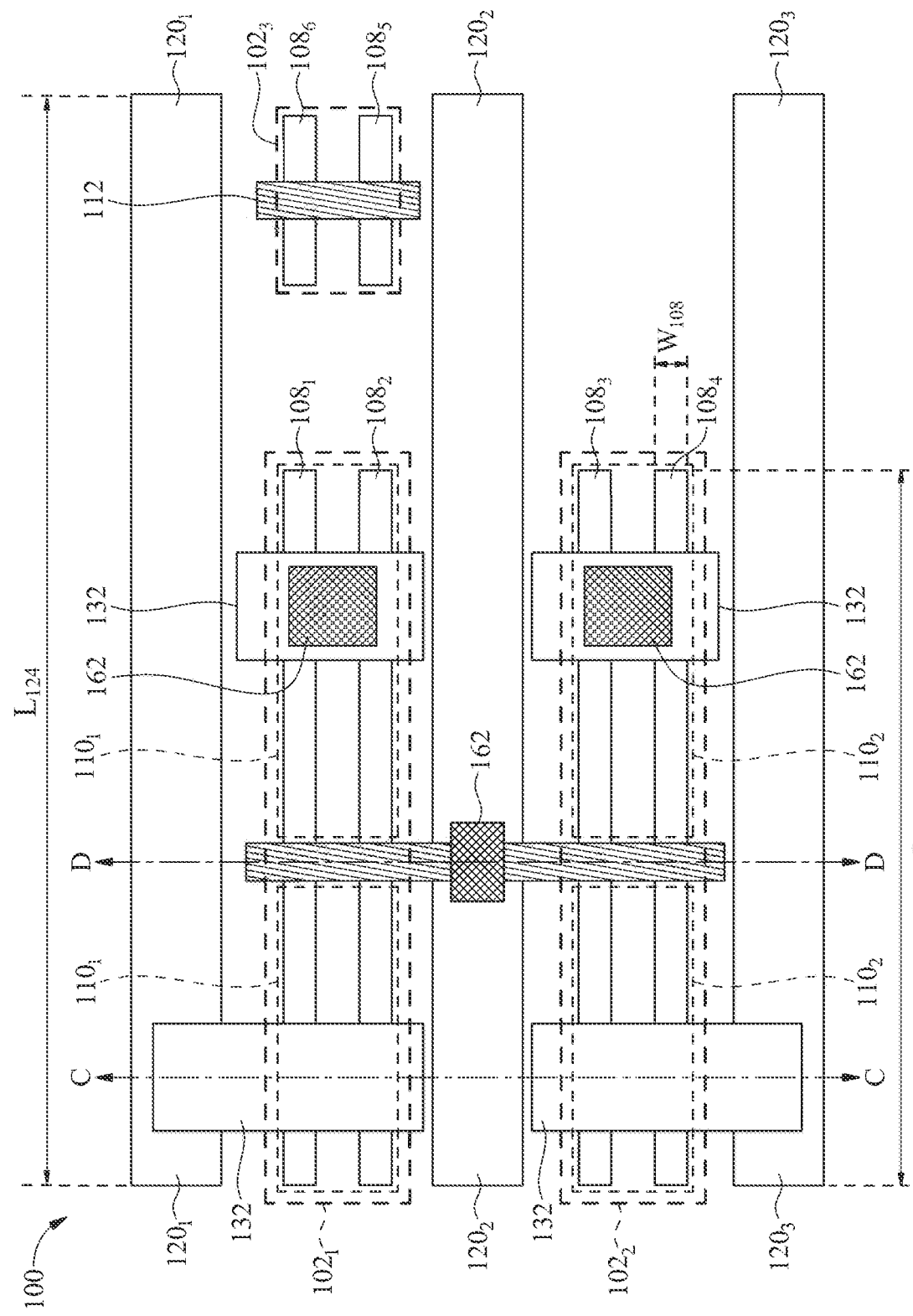
FIG. 1B illustrates a top view of a semiconductor device, according to some embodiments.

A semiconductor device 100 having multiple FETs 102 (e.g., FETs $102_1$ and $102_2$) and one or more conductive rail structures 120 (e.g., conductive rail structures $120_1$-$120_3$) to provide electrical connections for FETs 102, is described with reference to FIGS. 1A-1D, according to some embodiments. FIG. 1A illustrates an isometric view of semiconductor device 100, according to some embodiments. FIG. 1B illustrates a top view of semiconductor device 100, according to some embodiments. FIG. 1C illustrates a cross-sectional view along a source/drain (S/D) region (e.g., line C-C of FIGS. 1A and 1B) of semiconductor device 100, according to some embodiments. FIG. 1D illustrates a cross-sectional view along a gate region (e.g., line D-D of FIGS. 1A and 1B) of semiconductor device 100, according to some embodiments. Semiconductor device 100 can be included in a microprocessor, memory cell, or other integrated circuit (IC). Even though two FETs 102 (e.g., FET $102_1$ and $102_2$) are shown in semiconductor device 100, semiconductor device 100 can have any number of FETs 102. Further, the scale and shapes of various labeled elements in isometric and cross-sectional views of semiconductor device 100 are shown for illustration purposes and not intended to be limiting.

Referring to FIG. 1A, FETs 102 and conductive rail structures 120 can be formed on a substrate 106. Substrate 106 can be a semiconductor material, such as silicon. In some embodiments, substrate 106 can include a crystalline silicon substrate (e.g., wafer). In some embodiments, substrate 106 can include (i) an elementary semiconductor, such as silicon (Si) and germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 106 can be doped depending on design requirements (e.g., p-type substrate or n-type substrate). In some embodiments, substrate 106 can be doped with p-type dopants (e.g., boron (B), indium (In), aluminum (Al), or gallium (Ga)) and/or n-type dopants (e.g., phosphorus (P) or arsenic (As)).

Referring to FIGS. 1A and 1B, FETs 102 (e.g., FET $102_1$ and $102_2$) can be a FinFET or a GAA FET that can include one or more fin structures 108 extending along a first horizontal direction (e.g., in the x-direction), and a gate structure 112 traversing through the one or more fin structures 108 along a second horizontal direction (e.g., in the y-direction). For example, FET $102_1$ can include two fin structures 108 (e.g., fin structures $108_1$ and $108_2$) traversed by gate structure 112. Similarly, FET $102_2$ can include another two fin structures 108 (e.g., fin structures $108_3$ and $108_4$) traversed by gate structure 112. As shown in FIGS. 1A and 1B, FETs $102_1$ and $102_2$ can have a common gate structure 112. In some embodiments, gate structures 112 of FETs $102_1$ and $102_2$ can be isolated from each other. In some embodiments, each fin structure 108 can accommodate more than one FET 102. For example, even though fin structures $108_1$ and $108_2$ can accommodate FET $102_1$ as illustrated in FIGS. 1A and 1B, fin structures $108_1$ and $108_2$ can be further shared by another FET 102 (not shown in FIGS. 1A and 1B) adjacent to FET $102_1$ along the first horizontal direction (e.g., in the x-direction). In some embodiments, fin structure 108 can have a length $L_{108}$ (e.g., shown in FIG. 1B) along the first horizontal direction (e.g., in the x-direction) ranging from about 100 nm to about 1 µm. In some embodiments, fin structure 108 can have a width $W_{108}$ (e.g., shown in FIG. 1B) along the second horizontal direction (e.g., in the y-direction) ranging from about 3 nm to about 50 nm. Other lengths and widths for fin structure 108 are within the scope and spirit of this disclosure.

Referring to FIGS. 1C and 1D, each fin structure 108 (e.g., fin structures $108_1$-$108_4$) can include a fin base portion 108A and a stacked fin portion 108B disposed on fin base portion 108A. Fin base portion 108A can include a material similar to substrate 106, such as a material having a lattice constant substantially close to (e.g., lattice mismatch within 5%) that of substrate 106. In some embodiments, fin base portion 108A can include a material identical to substrate 106. Stacked fin portion 108B can include a material similar to substrate 106 (e.g., lattice mismatch within 5%) that functions as FET 102's channel. In some embodiments, stacked fin portion 108B can include multiple channel layers, each made of identical or different materials from each other. In some embodiments, fin base portion 108A and stacked fin portion 108B can have respective vertical (e.g., in the z-direction) heights ranging from about 40 nm to about 60 nm.

FET 102 can further include epitaxial fin regions 110 (e.g., epitaxial fin regions $110_1$ for FET $102_1$, and epitaxial fin regions $110_2$ for FET $102_2$) that function as FET 102's S/D regions. Epitaxial fin region 110 can be grown over portions of fin base portion 108A that do not underlie gate structures 112. Stacked fin portion 108B can be interposed between a pair of epitaxial fin regions 110. Epitaxial fin region 110 can include an epitaxially-grown semiconductor material. In some embodiments, the epitaxially grown semiconductor material can be the same material as the material of substrate 106. In some embodiments, the epitaxially-grown semiconductor material can include a material similar to the material of substrate 106. For example, the epitaxially-grown semiconductor material can have a lattice constant substantially close to (e.g., lattice mismatch within 5%) that of the material of substrate 106. In some embodiments, the epitaxially-grown semiconductor material can include: (i) a semiconductor material, such as Ge and Si; (ii) a compound semiconductor material, such as GaAs and AlGaAs; or (iii) a semiconductor alloy, such as SiGe and GaAsP. Epitaxial fin region 110 can be doped with p-type dopants or doped with n-type dopants. The p-type dopants can include B, In, Al, or Ga. The n-type dopants can include P or As. In some embodiments, epitaxial fin regions 110 associated with different FETs 102 can have different doping type. For example, epitaxial fin region $110_1$ can be doped as n-type, while epitaxial fin region $110_2$ can be doped as p-type.

Gate structure 112 can be multi-layered structures that wraps around portions of one or more fin structures 108. For example, gate structure 112 can wrap around portions of fin structures $108_1$ and $108_2$ to modulate a conductivity of FET $102_1$'s channel. In some embodiments, gate structure 112 can be referred to as gate-all-around (GAA) structures, where FET 102 can be referred to as a GAA FET 102. Gate structure 112 can include an oxide layer 112A, a gate dielectric layer 112B disposed on oxide layer 112A, a gate electrode 112C disposed on dielectric layer 112B, and gate spacers 114 disposed on sidewalls of gate electrode 112C. In some embodiments, gate structure 112 can further include an insulating layer 164 to separate gate structure 112's gate electrode 112C from another gate structure 112's gate electrode 112C.

Oxide layer 112A can be a dielectric material wrapped around portions of fin structure 108, such as stacked fin portion 108B. In some embodiments, oxide layer 112A can be disposed between gate electrode 112C and S/D regions 110 to prevent electrical shorting in between. In some embodiments, oxide layer 112A can include a semiconductor oxide material (e.g., silicon oxide or silicon germanium oxide) and can have a thickness ranging from about 1 nm to about 10 nm. Other materials and formation methods for oxide layer 112A are within the scope and spirit of this disclosure.

Gate dielectric layer 112B can be wrapped around portions of fin structure 108 (stacked fin portion 108B) and disposed over oxide layer 112A. Gate dielectric layer 112B can be further disposed between gate electrode 112C and S/D regions 110 to prevent electrical shorting in between. Gate dielectric layer 112B can include silicon oxide and can be formed by chemical vapor deposition (CVD), atomic layer deposition (ALD), physical vapor deposition (PVD), e-beam evaporation, or other suitable processes. In some embodiments, gate dielectric layer 112B can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate (HfSiO_4$), zirconium oxide ($ZrO_2$), and zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, gate dielectric layer 112B can include a single layer or a stack of insulating material layers. Gate dielectric layer 112B can have a thickness ranging from about 1 nm to about 5 nm. Other materials and formation methods for gate dielectric layers 112B are within the scope and spirit of this disclosure.

Gate electrode 112C can be functioned as gate terminal of FET 102. Gate electrode 112C can include metal stacks wrapping about portions of fin structure 108 (stacked fin portion 108B). In some embodiments, gate electrode 112C can include a gate barrier layer (not shown in FIGS. 1A-1D), a gate work function layer (not shown in FIGS. 1A-1D), and a gate metal fill layer (not shown in FIGS. 1A-1D). The gate barrier layer can serve as a nucleation layer for subsequent formation of a gate work function layer. In some embodiments, the gate barrier layer can further prevent substantial diffusion of metals (e.g., aluminum) from the gate work function layer to underlying layers (e.g., gate dielectric layers 112B or oxide layers 112A). The gate barrier layer can include titanium (Ti), tantalum (Ta), titanium nitride (TiN), tantalum nitride (TaN), or other suitable diffusion barrier materials. The gate work function layer can include a single metal layer or a stack of metal layers. The stack of metal layers can include metals having work function values equal to or different from each other. In some embodiments, the gate work function layer can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, the gate work function layer can include Al-doped metal, such as Al-doped Ti, Al-doped TiN, Al-doped Ta, and Al-doped TaN. Gate metal fill layer can include a single metal layer or a stack of metal layers. The stack of metal layers can include metals different from each other. In some embodiments, the gate metal fill layer can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and combinations thereof. Other materials for the gate barrier layer, the gate work function layer, and the gate metal fill layer are within the scope and spirit of this disclosure.

Gate spacer 114 can be in physical contact with oxide layers 112A and gate dielectric layers 112B, according to some embodiments. Gate spacer 114 can have a low-k material with a dielectric constant less than about 3.9. For example, gate spacer 114 can include insulating material, such as silicon oxide, silicon nitride, a low-k material, and a combination thereof. In some embodiments, gate spacer 114 can have a thickness ranging from about 2 nm to about 10 nm. Other materials and thicknesses for gate spacer 114 are within the scope and spirit of this disclosure.

FET 102 can further include S/D contact 132 formed over fin epitaxial region 110 to electrically connect the underlying fin epitaxial region 110 to other elements of the integrated circuit (not shown in FIGS. 1A-1D). S/D contact 132 can include a silicide layer and a conductive region over the silicide layer (not shown in FIGS. 1A-1D). The silicide layer can include metal silicide and can provide a low resistance interface between the conductive regions and the underlying fin epitaxial region 110. Examples of metal used for forming the metal silicide can be Co, Ti, and Ni. The conductive region can include conductive materials, such as W, Al, and Co. The conductive region can have an average horizontal dimension (e.g., width in the x-direction) in a range from about 15 nm to about 25 nm and can have an average vertical dimension (e.g., height in the z-direction) in a range from about 400 nm to about 600 nm. In some embodiments, at least one conductive liner (not shown) can be disposed between the silicide layer and the conductive region. The conductive liner can be a diffusion barrier and can include a single layer or a stack of conductive materials, such as TiN, Ti, Ni, TaN, Ta, and a combination thereof. In some embodiments, the conductive liner can act as an adhesion-promoting-layer, a glue-layer, a primer-layer, a protective-layer, and/or a nucleation-layer. The conductive liner can have a thickness in a range from about 1 nm to about 2 nm, according to some embodiments. Based on the disclosure herein, other materials and dimensions for the conductive liner, the silicide layer, and the conductive region are within the scope and spirit of this disclosure.

Referring to FIGS. 1A and 1C, semiconductor device 100 can further include etch stop layer (ESL) 116, interlayer dielectric (ILD) layer 118, and shallow trench isolation regions 138. ESL 116 can protect gate structure 112 and/or S/D region 110. This protection can be provided, for example, during formation of ILD layer 118 and/or S/D contact structures (not shown). ESL 116 can be disposed on sidewalls of gate spacers 114 and/or surfaces of S/D region 110. In some embodiments, ESL 116 can include, for example, silicon nitride, silicon oxide, silicon oxynitride, silicon carbide, silicon carbo-nitride, boron nitride, silicon boron nitride, silicon carbon boron nitride, or a combination thereof. In some embodiments, ESL 116 can have a thickness ranging from about 3 nm to about 30 nm. Other materials and thicknesses for ESL 116 are within the scope and spirit of this disclosure.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, ILD layer 118 can have a thickness from about 50 nm to about 200 nm. Other materials, thicknesses, and formation methods for ILD layer 118 are within the scope and spirit of this disclosure.

STI regions 138 can provide electrical isolation between horizontally (e.g., in the y-direction) adjacent fin structures 108. For example, STI regions 138 can electrically isolate fin structure $108_1$ from fin structure $108_2$. Accordingly, STI regions 138 can provide electrical isolation between FETs 102 residing on different fin structures 108. Also, STI regions 138 can provide electrical isolation between FETs 102 and neighboring active and passive elements (not shown) integrated with or deposited on substrate 106. In some embodiments, STI regions 138 can include multiple layers, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials.

Referring to FIGS. 1A, 1C and 1D, semiconductor device 100 can further include multiple conductive rail structures 120 (e.g., conductive rail structures $120_1$-$120_3$), each extending along the first horizontal direction (e.g., in the x-direction) and being disposed over STI region 138. Conductive rail structure 120 can be laterally (e.g., in the y-direction) adjacent to FETs 102 and can be configured as a metal interconnect for the adjacent FETs 102. For example, conductive rail structure $120_2$ can be disposed between FET $102_1$ and FET $102_2$ and can provide electrical connection for FET $102_1$ and/or FET $102_2$. In some embodiments, conductive rail structure 120 can be laterally (e.g., in the y-direction) disposed between outermost fin structures 108 of two horizontally (e.g., in the y-direction) adjacent FETs 102. For example, FET $102_1$ and FET $102_2$ can be horizontally (e.g., in the y-direction) adjacent to and facing each other. FET $102_1$ can include a group of fin structures 108 (e.g., fin structures $108_1$ and $108_2$), where fin structure $108_2$ can be regarded as FET $102_1$'s outermost fin structure 108 that faces FET $102_2$. Similarly, FET $102_2$ can include another group of fin structures 108 (e.g., fin structures $108_3$ and $108_4$), where fin structure $108_3$ can be regarded as FET $102_2$'s outermost fin structure 108 that faces FET $102_1$. Accordingly, conductive rail structure $120_2$ can be laterally (e.g., in the y-direction) disposed between FET $102_1$'s outermost fin structure $108_2$ and FET $102_2$'s outermost fin structure 108. In some embodiments, conductive rail structure 120 can be selectively disposed between two adjacent fin structures 108 far apart from each other. For example, as shown in FIG. 1D, semiconductor device 100 can include fin structures $108_1$, fin structure $108_2$ adjacent to fin structure $108_1$, and fin structure $108_3$ adjacent to fin structure $108_2$. Fin structures $108_2$ and $108_3$ can be relatively far from each other, and fin structures $108_1$ and $108_2$ can be relatively close to each other (e.g., separation $s_{102}$>$d_{102}$. Accordingly, conductive rail structure $120_2$ can be selectively disposed between fin structures $108_2$ and $108_3$ with wider separation $d_{102}$, while STI region 138, gate structure 112, or epitaxial fin region 110 can be disposed between fin structures $108_1$ and $108_2$ with narrower separation $s_{102}$. In some embodiments, conductive rail structure 120 can be laterally (e.g., in the y-direction) disposed between any two adjacent fin structures 108.

Referring to FIG. 1B, conductive rail structure 120 can be substantially parallel to its adjacent fin structures 108. For example, conductive rail structure $120_2$ can be adjacent to fin structures $108_2$ and $108_3$, where conductive rail structure $120_2$, fin structure $108_2$ and fin structure $108_3$ can all be extended along the first horizontal direction (e.g., in the x-direction). In some embodiments, conductive rail structure 120 can be extended through gate structure 112 of its adjacent FETs 102. For example, conductive rail structure $120_2$ can be adjacent to FET $102_1$, where conductive rail structure $120_2$ can be extended through FET $102_1$'s gate structure 112. Conductive rail structure 120 can be substantially extended beyond its adjacent fin structures 108 along the first horizontal direction (e.g., in the x-direction). For example, conductive rail structure 120 can have a length $L_{124}$ greater than or substantially equal to its adjacent fin structure 108's length $L_{108}$. In some embodiments, conductive rail structure 120's length $L_{124}$ can be from about 100 nm (e.g., greater than fin structure 108's length $L_{108}$) to about 50 μm (e.g., substantially equal to a circuit cell's width in the IC). In some embodiments, conductive rail structure 120 can be extended along the first horizontal direction (e.g., in the x-direction) and adjacent to a group of fin structures 108, where each of the group of fin structures 108 can be adjacent to one another along the first horizontal direction (e.g., in the x-direction). For example, as shown in FIG. 1B, conductive rail structure $120_1$ can be extended along the first horizontal direction (e.g., in the x-direction) parallel to both fin structures $108_1$ and $108_6$, where fin structures $108_1$ and $108_6$ can be adjacent to each other in the first horizontal direction (e.g., in the x-direction). Similarly, conductive rail structure $120_2$, fin structure $108_2$ and fin structures $108_5$ can all be extended along the first horizontal direction (e.g., in the x-direction), where fin structures $108_2$ and $108_5$ can be adjacent to each other in the first horizontal direction (e.g., in the x-direction). In some embodiments, conductive rail structure 120 can be extended along the first horizontal direction (e.g., in the x-direction) and adjacent to a group of FETs 102 that are adjacent to each other in the first horizontal direction. For example, conductive rail structure $120_1$ can be extended along the first horizontal direction (e.g., in the x-direction) parallel to both FETs $102_1$ and $102_3$, where FETs $102_1$ and $102_3$ can be adjacent to each other in the first horizontal direction (e.g., in the x-direction). In some embodiments, conductive rail structure 120 can be extended along the first horizontal direction (e.g., in the x-direction) and adjacent to a group of fin structures 108, where each of the group of fin structures 108 can be adjacent to one another along the second horizontal direction (e.g., in the y-direction). For example, conductive rail structure $120_2$ can be extended along the first horizontal direction (e.g., in the x-direction) parallel to both fin structures $108_2$ and $108_3$, where fin structures $108_2$ and $108_3$ can be adjacent to each other in the second horizontal direction (e.g., in the y-direction).

Referring to FIGS. 1C and 1D, conductive rail structure 120 can include a conductor layer 124, an insulating liner 126 disposed between conductor layer 124 and conductive rail structure 120's adjacent FET 102, and a padding layer 128 disposed under conductor layer 124 and/or insulating liner 126. Conductor layer 124 can be a power rail that connects adjacent FET 102 to a power level (e.g., $V_{DD}$) or a ground level (e.g., $V_{SS}$). For example, in some embodiments, FET 102's S/D contact 132 can be electrically connected to the power level or the ground level through conductive rail structure 120. In some embodiments, conductor layer 124 can be a metal wiring that provides interconnect for its adjacent FETs 102. Conductor layer 124 can be extended along the first horizontal direction (e.g., in the x-direction) parallel to conductive rail structure 120's adjacent fin structures 108. In some embodiments, conductor layer 124 can be extended horizontally longer (e.g., length $L_{124}$ in the x-direction) than its adjacent fin structures 108. Conductor layer 124 can be positioned at a substantially same vertical (e.g., in the z-direction) as its adjacent fin structures 108. In some embodiments, conductor layer 124's top surface $124_T$ can be vertically (e.g., in the z-direction) below its adjacent fin structure 108's top surface $108_T$. In some embodiments, conductor layer 124's top surface $124_T$ can be vertically (e.g., in the z-direction) below its adjacent epitaxial fin region 110's top surface $110_T$. Conductor layer 124 can include any conductive material suitable for metal interconnect. By way of example and not limitation, conductor layer 124 can include Cu, Co, Ni, Ru, Rh, Ir, Os, Al, In, W, carbon nanotubes, or a combination thereof. In some embodiments, conductor layer 124 can further include a barrier liner (not shown in FIGS. 1A-1D) to prevent metal inter-diffusion between conductive layer 124 and conductive layer 124's adjacent FETs 102. By way of example and not limitation, the barrier liner can include a metallic material (e.g., Ta or titanium tungsten (TiW)), a metal oxide (e.g., alumina, manganese oxide, chromium oxide, niobium oxide, or titanium oxide), a metal nitride (e.g. TaN, TiN), an organo-silane (e.g., trimethoxysilane with long akyl chain), an organo-phosphane, other suitable materials, or combinations thereof.

Insulating liner 126 can include any suitable insulating material to separate conductor layer 124 from one or more FETs 102 adjacent to conductive rail structure 120. For example, insulating liner 126 can be disposed between conductor layer 124 and conductive rail structure 120's adjacent fin structures 108. In some embodiments, insulating liner 126 can be disposed between conductor layer 124 and conductive rail structure 120's adjacent epitaxial fin regions 110. In some embodiments, insulating liner 126 can be disposed between conductor layer 124 and conductive rail structure 120's adjacent gate structure 112. In some embodiments, insulating liner 126 can surround conductor layer 124's sides and bottom. By way of example and not limitation, insulating liner 126 can include silicon dioxide, silicon dioxide, silicon nitride, silicon oxy-nitride, a low-k dielectric material, a high-k dielectric material, or a combination thereof.

Padding layer 128 can function as a sacrificial layer to protect conductive rail structure 120 during the processing steps of forming gate structure 112. Padding layer 128 can include any suitable dielectric material having different etching selectivity from insulating liner 126. In some embodiments, the etching selectivity of padding layer 128 to insulating liner 126 can be about 70 or greater. By way of example and not limitation, padding layer 128 can include silicon dioxide, silicon oxy-nitride, a low-k dielectric material, a high-k dielectric material, or a combination thereof.

In some embodiments, conductive rail structure 120 can further include a capping layer 130 disposed over conductor layer 124. Capping layer 130 can include any suitable insulating material to separate conductor layer 124 from S/D contact 132. In some embodiments, capping layer 130's top surface $130_T$ can be substantially coplanar with its adjacent fin structure 108's top surface $108_T$. By way of example and not limitation, capping layer 130 can include silicon dioxide, silicon dioxide, silicon oxy-nitride, a low-k dielectric material, a high-k dielectric material, or a combination thereof.

In some embodiments, semiconductor device 100 can further include a void structure 131 surrounded by conductive rail structure 120, fin epitaxial region 110, and fin structure 108 that connects to fin structure region 110. Void structure 131 can be extended along the first horizontal direction (e.g., in the x-direction) parallel to both conductive rail structure 120 and fin epitaxial region 110. In some embodiments, void structure 131 can be further surrounded by gate structure 112. In some embodiments, void structure can expose crystalline surface (e.g., (111) crystalline facet) of fin epitaxial region 110.

Semiconductor device 100 can further include interconnect structure 140 disposed over FETs 102. Interconnect structure 140 can provide metal wire routings for the underlying FETs 102. Interconnect structure 140 can include an ESL 146 and a layer of insulating material 148 disposed, both being disposed over FETs 102. ESL 146 and layer of insulating material 148 can be made of any suitable dielectric material that have different etching selectivity from each other. By way of example and not limitation, ESL 146 and layer of insulating material 148 can be made of silicon oxide, silicon nitride, a low-k dielectric material, or a high-k dielectric material. Interconnect structure 140 can further include a trench conductor layer 162 formed through layer of ESL 146 and layer of insulating material 148. Trench conductor layer 162 can electrically connect the underlying FET 102. For example, as shown in FIG. 1D, trench conductor layer 162 can be in contact with underlying FET 102's gate electrode 112C. In some embodiments, trench conductor layer 162 can be in contact with underlying FET 102's S/D contact 132. Trench conductor layer 162 can include any suitable conductive material, such as W, Al, Cu, Co, Ti, Ta, Ru, Mo, a silicide material, and a conductive nitride material. In some embodiments, interconnect structure 140 can further include a layer of conductive material (not shown in FIGS. 1C-1D) disposed over trench conductor, where the layer of conductive material can be a metal wire routing for the underlying FETs 102.

Figure 2:
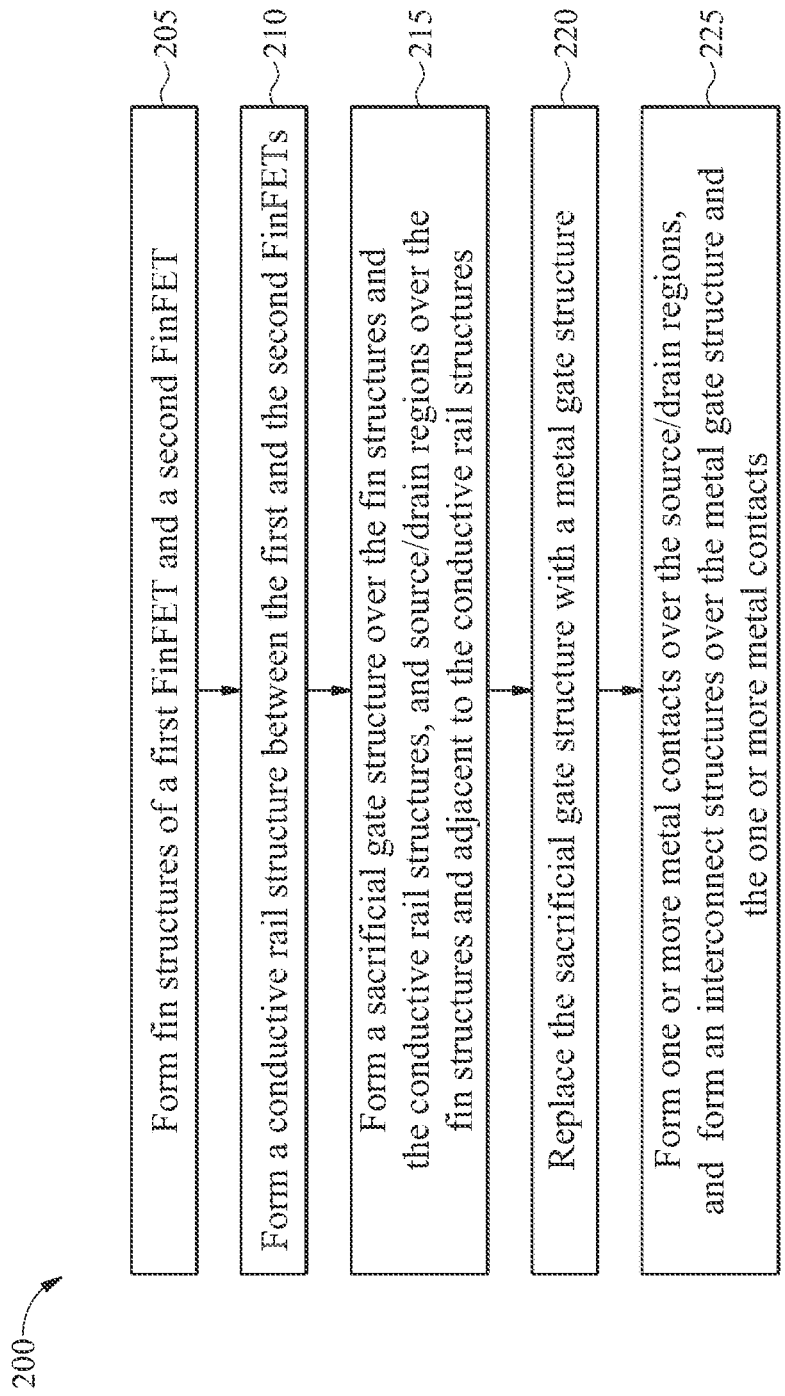
FIG. 2 is a flow diagram of a method for fabricating a semiconductor device, according to some embodiments.

FIG. 2 is a flow diagram of a method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3-12, 13A-13C, 14, 15A and 15B. FIGS. 3-7 are cross-sectional views along line C-C of FIGS. 1A, according to some embodiments. FIGS. 8-12, 13A, 14, and 15A are isometric views of semiconductor device 100 at various stages of its fabrication, according to some embodiments. FIGS. 13B and 13C are cross-sectional views along lines D-D and C-C, respectively, of structures of FIG. 13A at various stages of its fabrication, according to some embodiments. FIG. 15B is a cross-sectional view along line C-C of the structure of FIG. 15A at various stages of its fabrication, according to some embodiments. Operations can be performed in a different order or not performed depending on specific applications. Method 200 may not produce a complete semiconductor device 100. Accordingly, it is understood that additional processes can be provided before, during, and after method 200, and that some other processes may only be briefly described herein. Further, the discussion of elements in FIGS. 1A-1D, 3-12, and 13A-13C with the same annotations applies to each other, unless mentioned otherwise.

Figure 3:
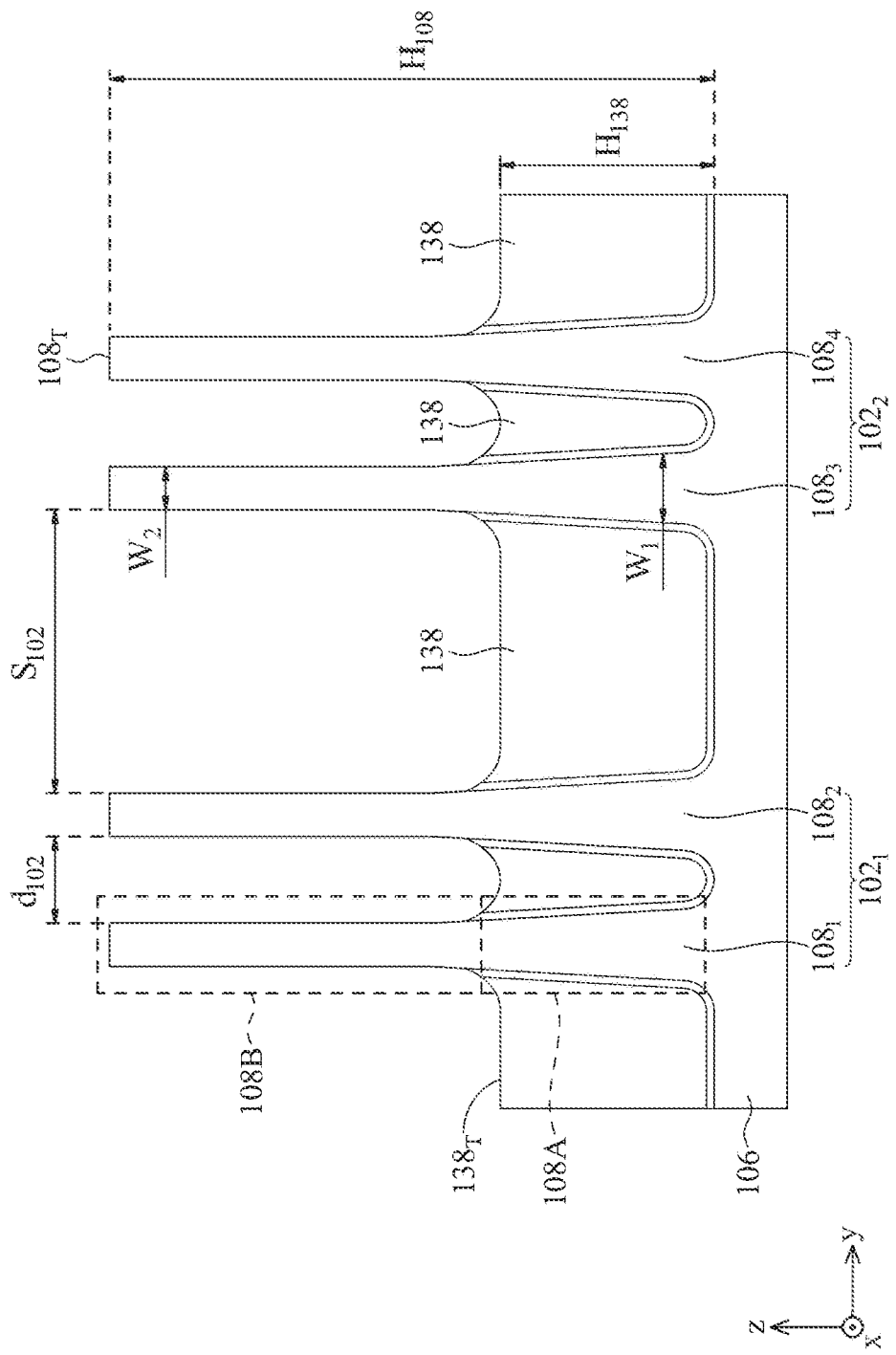
FIGS. 3-7 illustrate cross-sectional views of a semiconductor device at various stages of its fabrication process, according to some embodiments.

In operation 205, multiple fin structures are formed for a first FinFET and a second FinFET. For example, as shown in FIG. 3, fin structures 108$_1$ and 108$_2$ can be formed on substrate 106 for FET 102$_1$. Similarly, fin structures 108$_3$ and 108$_4$ can be formed on substrate 106 for FET 102$_2$. The formation of fin structures 108 (e.g., fin structures 108$_1$-108$_4$) can include (i) patterning a hard mask layer (not shown in FIG. 3) on substrate 106, (ii) and etching substrate 106 through the patterned hard mask layer. By way of example and not limitation, the hard mask layer can be a thin film including silicon oxide formed, for example, using a thermal oxidation process. In some embodiments, the hard mask layer can be formed of silicon nitride using, for example, a low pressure chemical vapor deposition (LPCVD) or a plasma enhanced CVD (PECVD) process.

The patterned hard mask can define FETs 102's fin structures 108. For example, the patterned hard mask can define the number of fin structures 108 within each FET 102. In some embodiments, the patterned hard mask can define separation d102 ranging from about 10 nm to about 50 nm between fin structures 108 within each FET 102. In some embodiments, the patterned hard mask can define separation s102, which can range from about 20 nm to about 100 nm between two adjacent FETs 102. The etching of the substrate 106 can include a dry etch, a wet etch process, or a combination thereof. The dry etch process can include using etchants with an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable etching gases and/or plasmas, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof. In some embodiments, after the etching of substrate 106, the resulting fin structure 108 can each have a height $H_{108}$ ranging from about 60 nm to about 120 nm. In some embodiments, after the etching of substrate 106, the resulting fin structure 108 can each have a tapered cross-section along a YZ-plane with a horizontal (e.g., in the y-direction) width $W_1$ near substrate 106 greater than a horizontal width $W_2$ near fin structure 108's top surface 108$_T$. In some embodiments, horizontal widths $W_1$ and $W_2$ can each range from about 6 nm to about 20 nm.

Further, in operation 205, STI regions 138 can be formed on substrate 106 and between fin structures 108. By way of example and not limitation, the formation of STI regions 138 can include (i) depositing a layer stack of insulating material over substrate 106 and fin structures 108 using a suitable deposition process, such as atomic layer deposition (ALD), chemical vapor deposition (CVD), flowable CVD (FCVD), high-density-plasma (HDP) CVD, sub-atmospheric CVD (SACVD), and high aspect-ratio process (HARP), (ii) annealing the layer stack of insulating material, (iii) chemical mechanical polishing (CMP) the layer stack of insulating material, and (vi) etching back, using a dry etching and/or a wet etching process, the polished layer stack of insulating material to form STI regions 138 between fin structures 108. After the etching back, the resulting STI region 138 can have a top surface 138$_T$ vertically (e.g., in the z-direction) below fin structure 108's top surface 108$_T$. In some embodiments, portions of fin structure 108 vertically (e.g., in the z-direction) between top surfaces 108$_T$ and 138$_T$ can be regarded as stacked fin portion 108B that can become FET 102's channel region, while portions of fin structure 108 vertically (e.g., in the z-direction) below top surface 138$_T$ can be regarded as fin base portion 108A. In some embodiments, STI region 138 can have a height HM ranging from about 40 nm to about 60 nm. Other materials, formation methods, and dimensions for STI regions 138 are within the scope and spirit of this disclosure.

In some embodiments, prior to the patterning a hard mask layer (not shown in FIG. 3) on substrate 106, the formation of fin structure can further include epitaxially growing one or more semiconductor layers (not shown in FIG. 3) over substrate 106. The one or more semiconductor layers can include semiconductor materials similar to (e.g., lattice mismatch within 5%) or different from substrate 106. In some embodiments, the one or more semiconductor layers include silicon or silicon germanium (SiGe) with Ge concentration from about 25 atomic percent to about 50 atomic percent. In some embodiments, the one or more semiconductor layers can be epitaxially grown using (i) a chemical vapor deposition (CVD) process, such as a LPCVD, atomic layer CVD (ALCVD), ultrahigh vacuum CVD (UHVCVD), reduced pressure CVD (RPCVD), and any other suitable CVD process; (ii) molecular beam epitaxy (MBE) processes; (iii) any suitable epitaxial process; or (iv) a combination thereof. In some embodiments, the one or more semiconductor layers can be undoped or can be in-situ doped during their epitaxial growth process using (i) p-type dopants, such as boron, indium, and gallium; and/or (ii) n-type dopants, such as phosphorus and arsenic. For p-type in-situ doping, p-type doping precursors, such as diborane ($B_2H_6$), boron trifluoride ($BF_3$), and other p-type doping precursors can be used. For n-type in-situ doping, n-type doping precursors, such as phosphine ($PH_3$), arsine ($AsH_3$), and/or other n-type doping precursor can be used.

Referring to FIG. 2, in operation 210, a conductive rail structure is formed between the first FinFET and the second FinFET. For example, as shown in FIG. 7, each of conductive rail structures 120 (e.g., conductive rail structures $120_1$-$120_3$) can be formed between adjacent fin structures 108. The formation of conductive rail structures 120 can include (i) forming a padding layer 428 and an insulating liner 426 (both shown in FIG. 4) over the structure of FIG. 3, (ii) forming a conductor layer 124 (shown in FIG. 5) over the structure of FIG. 4, (iii) forming a capping layer 130 (shown in FIG. 6) over conductor layer 124, and (iv) recessing padding layer 628 (shown in FIG. 6) to expose each fin structures 108 and insulating liner 126 (shown in FIG. 7).

Figure 4:
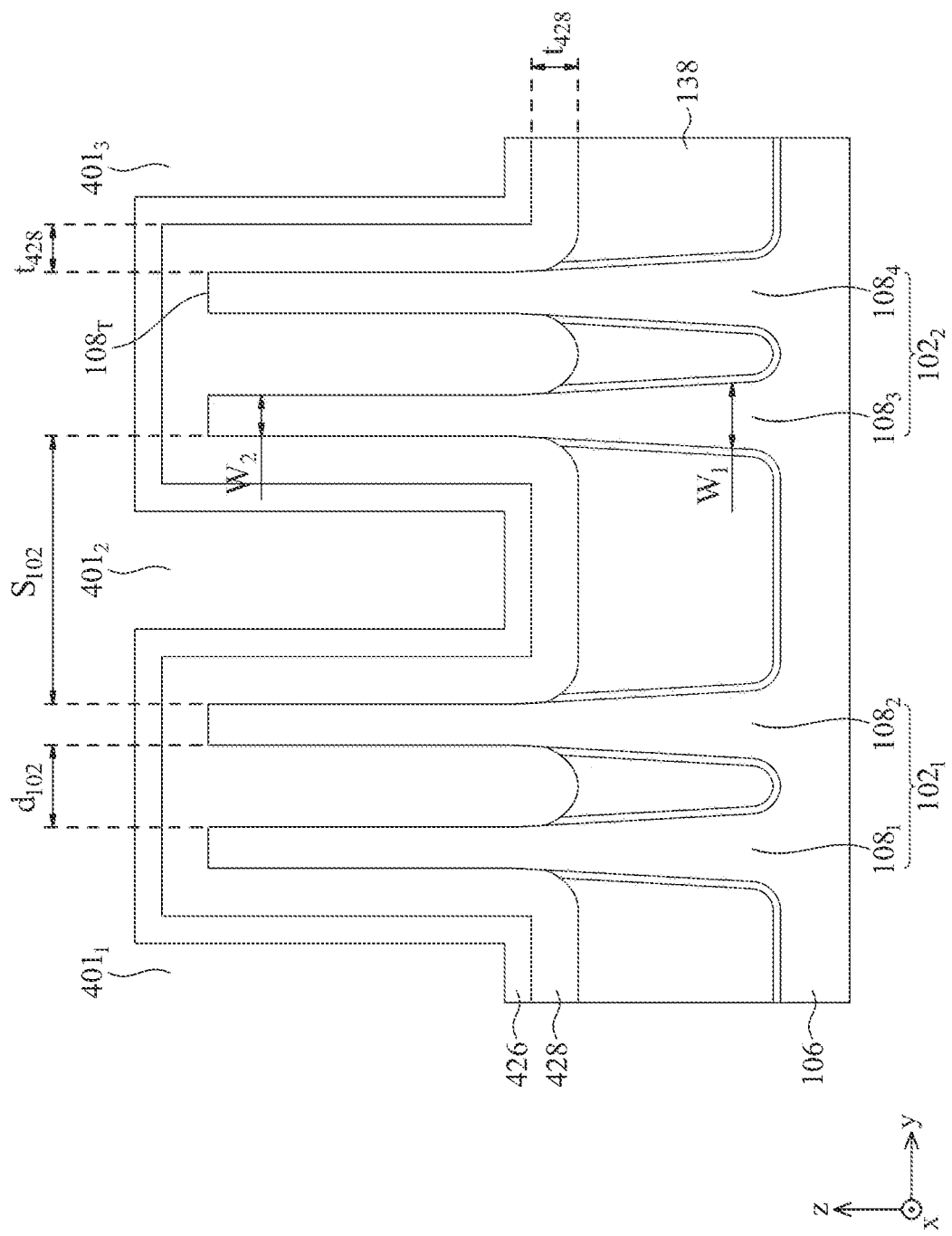

Referring to FIG. 4, the formation of padding layer 428 can include depositing one or more layers of insulating material on the structure of FIG. 3. The one or more layers of insulating material for padding layer 428 can include any suitable dielectric material, such as silicon oxide, aluminum oxide, silicon nitride, silicon oxynitride, fluoride-doped silicate glass (FSG), an oxide material, a nitride material, a low-k material, and a high-k material. The one or more layers insulating material for forming padding layer 428 can be deposited using a suitable process for depositing dielectric materials, such as an ALD process and a CVD process. As shown in FIG. 4, the resulting padding layer 428 can be conformally formed with trench structure 401 (e.g., trench structures $401_1$-$401_3$) over STI region 138 and fin structures 108. Trench structure 401 can be extended parallel to its adjacent fin structures 108 (e.g., along the x-direction). In some embodiments, trench structure 401 and its adjacent fin structures 108 can be extended in an identically horizontal direction (e.g., along the x-direction), while trench structure 401 can have a length (not shown in FIG. 4) longer than or substantially equal to the length of its adjacent fin structures 108 along the identically horizontal direction. In some embodiments, padding layer 428 can have a thickness $t_{428}$ greater than separation $d_{102}$ between fin structures 108 within each FET 102, while thickness $t_{428}$ can be less than separation $S_{102}$ between two adjacent FETs 102. Accordingly, padding layer 428 can encapsulate fin structures 108 within each FET 102, while padding layer 428 can be formed with trench structure 401 between each FET 102. For example, as shown in FIG. 4, padding layer 428 can encapsulate fin structures $108_1$ and $108_2$ within FET $102_1$ and fin structures $108_3$ and $108_4$ within FET $102_2$, while padding layer 428 can be formed in trench structure $401_2$ between FET $102_1$ and FET $102_2$. In some embodiments, padding layer 428's thickness $t_{428}$ can range from about 5 nm to about 10 nm.

The formation of insulating liner 426 can include depositing one or more layers of insulating material over padding layer 428. The one or more layers of insulating material for insulating liner 426 can have different selectivity as padding layer 428. In some embodiments, an etching selectivity of insulating liner 426 to padding layer 428 can be about 70 or greater. By way of example and not limitation, the one or more layers of insulating material for insulating liner 426 can include silicon nitride, silicon carbon nitride, hafnium oxide, zirconium oxide, a low-k material, or a high-k material. The one or more layers insulating material for forming insulating liner 426 can be deposited using a suitable process for depositing dielectric materials, such as an ALD process and a CVD process. In some embodiments, insulating liner 426 can have a thickness ranging from about 5 nm to about 10 nm.

Figure 5:
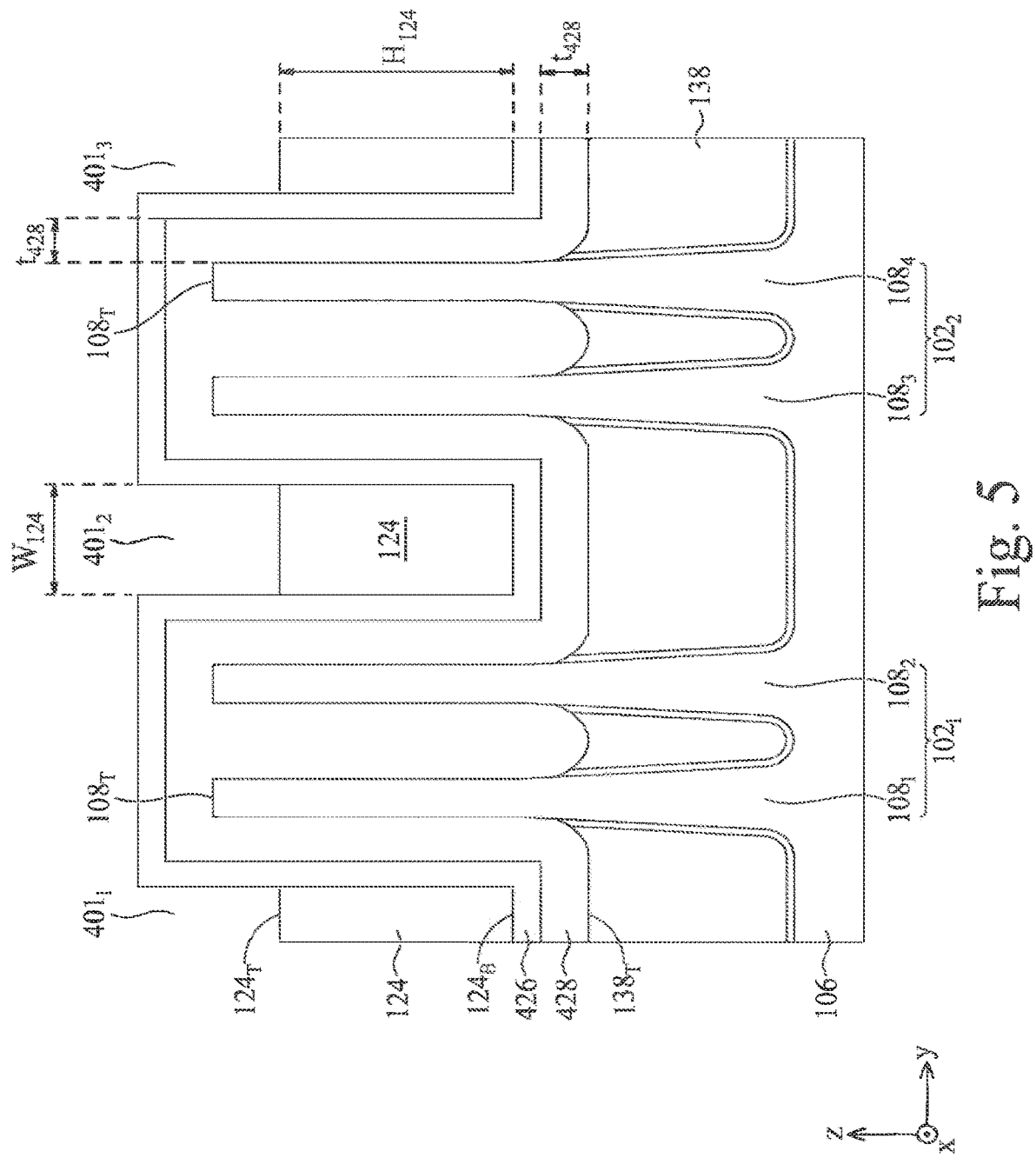

Referring to FIG. 5, the formation of conductor layer 124 can include (i) depositing one or more layers of conductive material over the structure of FIG. 4 (e.g., over trench structure $401_1$-$401_3$ shown in FIG. 4), and (ii) etching back the deposited one or more layers of conductive material. In some embodiments, the formation of conductor layer 124 can further include patterning a hard mask layer (not shown in FIG. 5) over the deposited the one or more layers of conductive material using a lithography process and etching back the one or more layers of conductive material through the patterned hard mask layer. The one or more layers of conductive material can include any suitable conductive material having low resistivity. By way of example and not limitation, the one or more layers of conductive material for conductor layer 124 can include W, Al, Cu, Co, Ti, Ta, Ru, Mo, a silicide material, and a conductive nitride material. The one or more layers of conductive material can be deposited using a suitable deposition process, such as a CVD process, an ALD process, a PVD process, a thermal evaporation process, and an e-beam evaporation process. The etch back of the one or more layers of conductive material can be performed by a dry etching process, a wet etching process, or a combination thereof that can selectively etch from the one or more layers of conductive material from insulating liner 426 and/or padding layer 428. In some embodiments, each of the dry etching process and wet etching process can have an etching selectivity of the one or more layers of conductive material to insulating liner 426 of being 70 or greater. In some embodiments, the dry etch process can include using a plasma dry etch with and inert gases, such as Ar, xenon (Xe), He, and a combination thereof. In some embodiments, the dry etch process can include using a plasma dry etch with a gas mixture with a pressure ranging from about 1 mTorr to about 100 mTorr. In some embodiments, the wet etch process can include using hydrofluoric acid or phosphoric acid as etchants. After the etching back process, the resulting conductor layer 124 within each trench structures 401 (e.g., trench structures $401_1$-$401_3$) can be separated from each other. In some embodiments, after the etching back process, the resulting conductor layer 124 can have its top surface $124_T$ vertically below or substantially coplanar with fin structure 108's top surface $108_T$. In some embodiments, after the etching back process, the resulting conductor layer 124 can have a height $H_{124}$ substantially closed to portions of fin structure 108's height above STI region 138, such as ranging from about 30 nm to about 50 nm. In some embodiments, after the etching back process, the resulting conductor layer 124 can have a width $W_{124}$ substantially identical to separation between two adjacent FETs 102, such as ranging from about 80 nm to about 150 nm.

Figure 6:
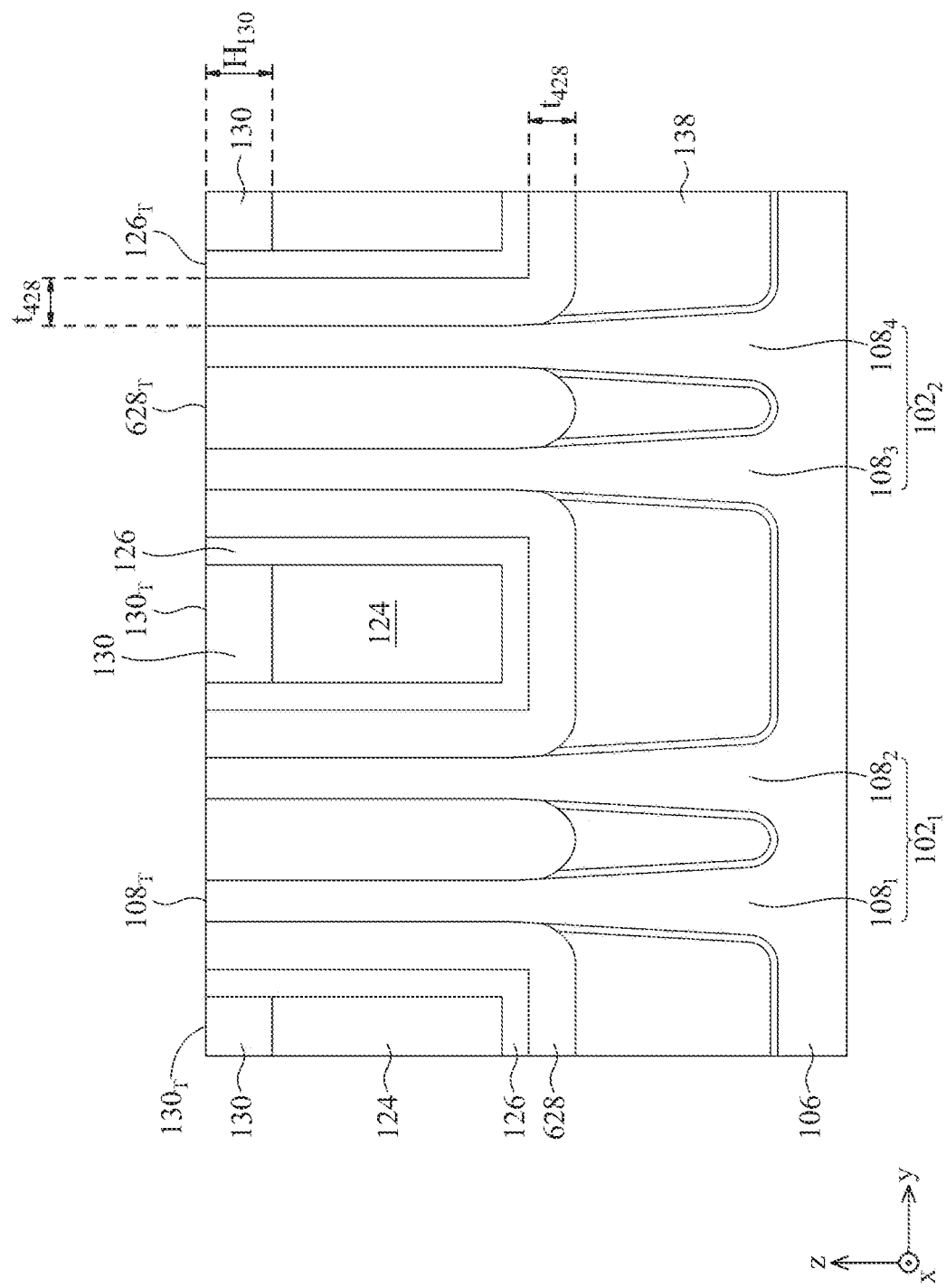
Figure 7:
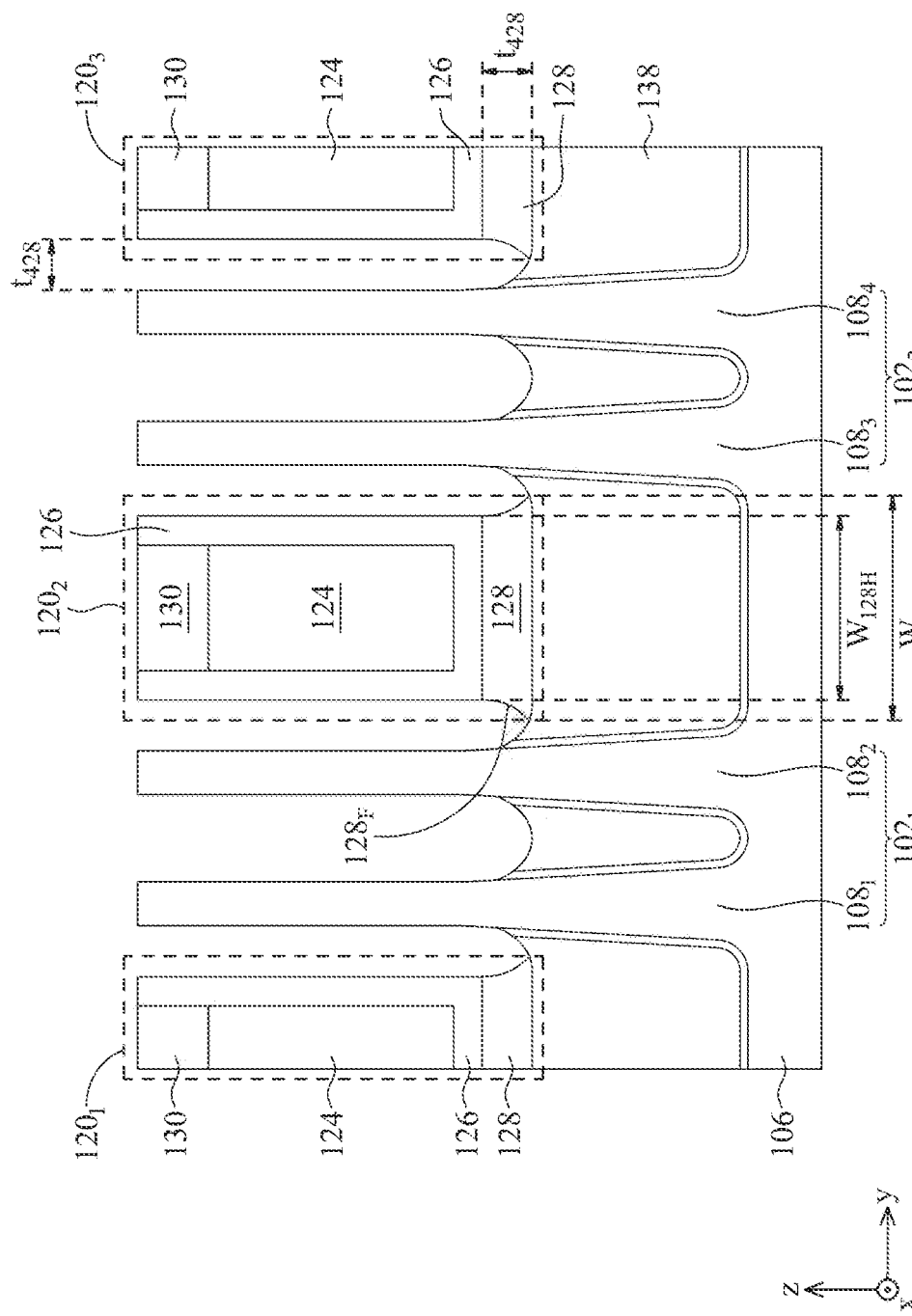

Referring to FIG. 6, the formation of capping layer 130 can include (i) depositing one or more layers of dielectric materials over the structure of FIG. 5 (e.g., over conductor layer 124 and insulating liner 426), and (ii) polishing the deposited one or more layers of dielectric materials for the formation of capping layer 130 using, for example, a CMP process. The one or more layers of dielectric material for capping layer 130 can include any suitable insulating material, such as a low-k dielectric material and a high-k dielectric material. By way of example and not limitation, the one or more layers of dielectric material for capping layer 130 can include silicon nitride, silicon carbon nitride, hafnium oxide, zirconium oxide, a low-k material, or a high-k material. In some embodiments, the one or more layers of dielectric material for capping layer 130 can be made of identical materials as insulating liner 426. In some embodiments, the one or more layers of dielectric material for capping layer 130 can have different selectivity as padding layer 428. The one or more layers dielectric material for forming capping layer 130 can be deposited using a suitable process for depositing dielectric materials, such as an ALD process and a CVD process. The polishing of the deposited one or more layers of dielectric material can remove portions of the deposited one or more layers of dielectric material to form capping layer 130 with a planarized top surface $130_T$. In some embodiments, the polishing of the deposited one or more layers of dielectric material can remove portions of insulating liner 426 to form insulating liner 126 with a planarized top surface $126_T$. In some embodiments, the polishing of the deposited one or more layers of dielectric material can remove portions of padding layer 428 to form padding layer 628 with a planarized top surface $628_T$. In some embodiments, top surfaces $130_T$, $126_T$ and $628_T$ can be substantially coplanarized with adjacent fin structures 108's top surface $108_T$. In some embodiments, after the polishing process, the resulting capping layer 130 can have a height $H_{130}$ ranging from about 5 nm to about 20 nm.

Referring to FIG. 7, the recessing of padding layer 628 can be performed by a dry etching process, a wet etching process, or a combination thereof to form padding layer 128. Each of the dry etching process and wet etching process can have an etching selectivity of padding layer 628 to capping layer 130 and/or insulating liner 126 of being 70 or greater. Accordingly, padding layer 628 can be removed by the dry etching process and/or the wet etching process using capping layer 130 and/or insulating liner 216 as a hard mask. In some embodiments, the dry etch process can include using a plasma dry etch with a gas mixture having octafluorocyclobutane ($C_4F_8$), argon (Ar), $O_2$, and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. Accordingly, after the recessing of padding layer 628, padding layer 128 can be formed under capping layer 130, insulating liner 126, and conductor layer 124. Further, the recessing of padding layer 628 can expose sidewalls of each fin structures 108. In some embodiments, after the recessing of padding layer 628, the resulting padding layer 128 can include footing structures $128_F$ at opposite sides of padding layer 128 to form slanting sidewalls for padding layer 128. In some embodiments, padding layer 128 that includes footing structure $128_F$ can have a bottom width $W128_L$ ranging from about 20 nm to about 70 nm and a top width $W128_H$ ranging from about 30 nm to about 100 nm. In some embodiments, after forming padding layer 128, a separation between the resulting conductor rail structure 120 and the adjacent fin structure 108 can be substantially equal to padding layer 128's thickness $t_{428}$.

Referring to FIG. 2, in operation 215, multiple sacrificial gate structures and source/drain regions are formed on the multiple fin structures. For example, as shown in FIG. 10, multiple polysilicon structures 812 can be formed on each fin structure 108 and on conductive rail structures 120, and epitaxial fin regions 110 (e.g., epitaxial fin regions $110_1$ and $110_2$) can be formed on each fin structure 108 and adjacent to conductive rail structures 120 as described in reference to FIGS. 8-10. The formation of polysilicon structure 912 and epitaxial fin region 110 can include (i) forming one or more polysilicon structures 812 over fin structures 108 and conductive rail structures 120 (shown in FIG. 8), (ii) forming gate spacers 114 on polysilicon structures 812' sidewalls (shown in FIG. 9), and (iii) forming fin epitaxial regions 110 over substrate 106 (shown in FIG. 10).

Figure 8:
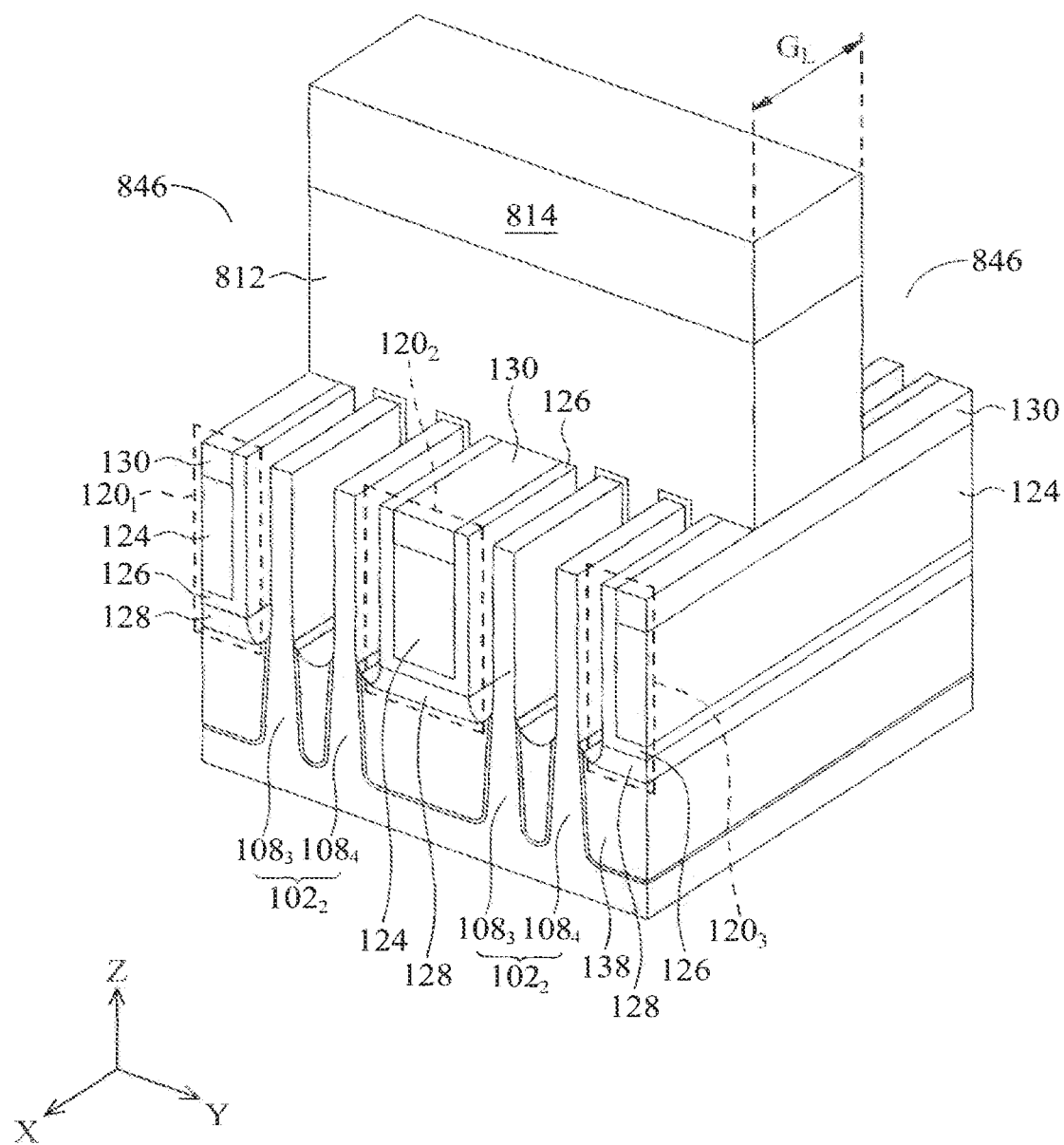
FIGS. 8-12 and 13A illustrate isometric views of a semiconductor device at various stages of its fabrication process, according to some embodiments.

Referring to FIG. 8, the formation of polysilicon structures 812 can include (i) blanket depositing a layer of polysilicon material over fin structures 108 and conductive rail structures 120 (e.g., conductive rail structures $120_1$-$120_3$), and (ii) etching the layer of polysilicon material through a patterned hard mask layer 814 formed on the layer of polysilicon material. In some embodiments, the layer of polysilicon material can be undoped, and hard mask layer 814 can include an oxide layer and/or a nitride layer. The oxide layer can be formed using a thermal oxidation process and the nitride layer can be formed by LPCVD or PECVD. Hard mask layer 814 can protect polysilicon structures 812 from subsequent processing steps (e.g., during formation of gate spacers 114, epitaxial fin regions 110, ILD layer 118, and/or ESL 116).

The blanket deposition of the layer of polysilicon material can include CVD, PVD, ALD, or other suitable deposition processes. The etching of the deposited layer of polysilicon material can include a dry etch, a wet etch, or a combination thereof to form polysilicon structures, each having horizontal (e.g., in the x-direction) dimension $G_L$ and vertical (e.g., in the z-direction) height $G_H$. In some embodiments, vertical dimensions $G_H$ of polysilicon structures 812 can be from about 100 nm to about 150 nm. Polysilicon structures 812 can have an aspect ratio equal to or greater than about 9, where the aspect ratio is a ratio of dimension $G_H$ to dimension $G_L$. In some embodiments, the etching of the deposited layer of polysilicon material to form polysilicon structures 812 can include four etching steps. The first polysilicon etch step can include using a gas mixture having HBr, $O_2$, $CHF_3$, and $Cl_2$. The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and Ar at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. The first polysilicon etch step can have a higher polysilicon etch rate than the second, third, and/or fourth polysilicon etch steps. The first polysilicon etch step is used to etch unwanted portions of the blanket deposited layer of polysilicon material above fin structures 108 and conductive rail structures 120. The second, third, and fourth polysilicon etch steps are used to etch unwanted portions of the blanket deposited layer of polysilicon material within spaces 846 with an aspect ratio, such as greater than about 1:15.

Figure 9:
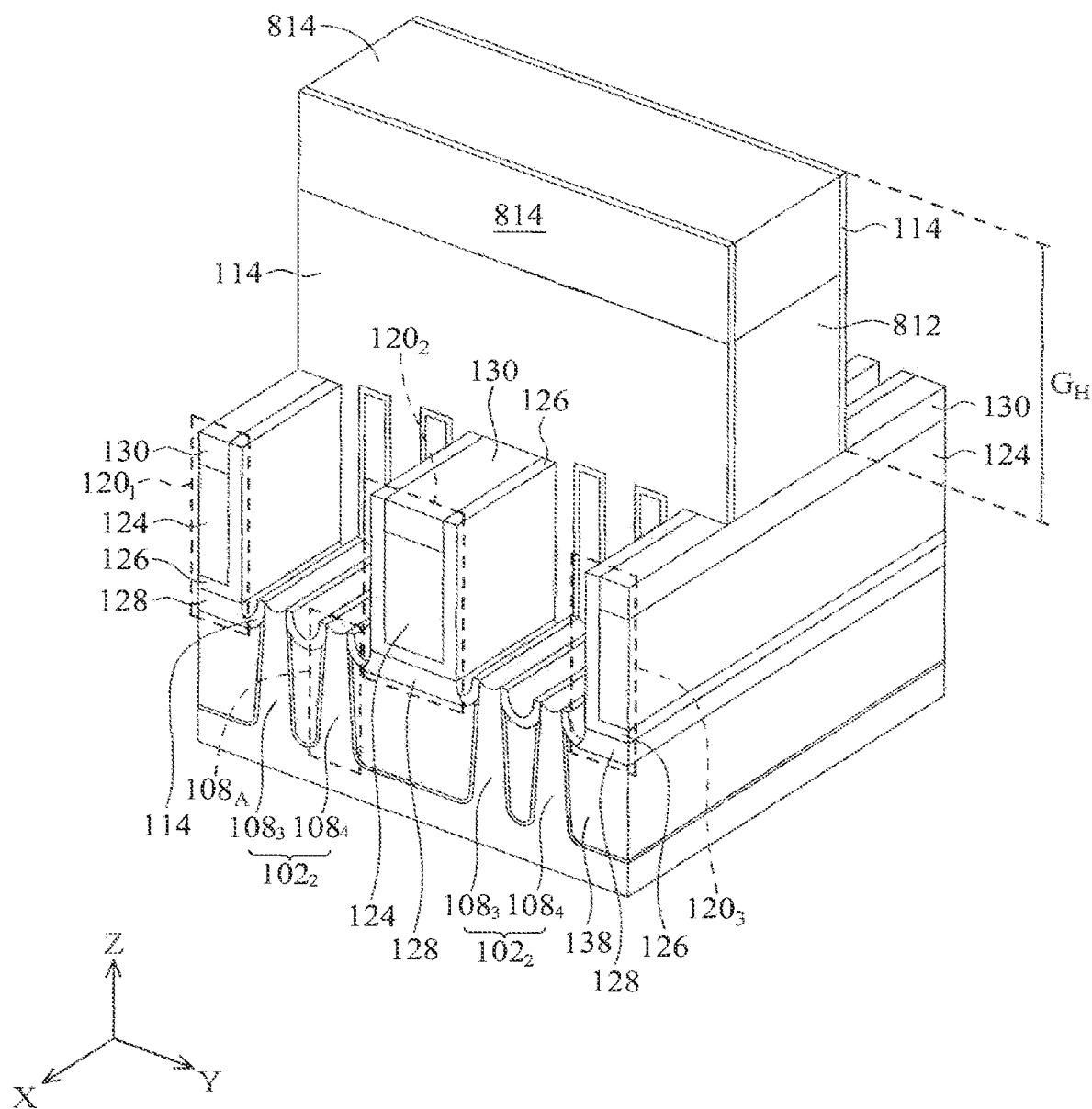
Figure 10:
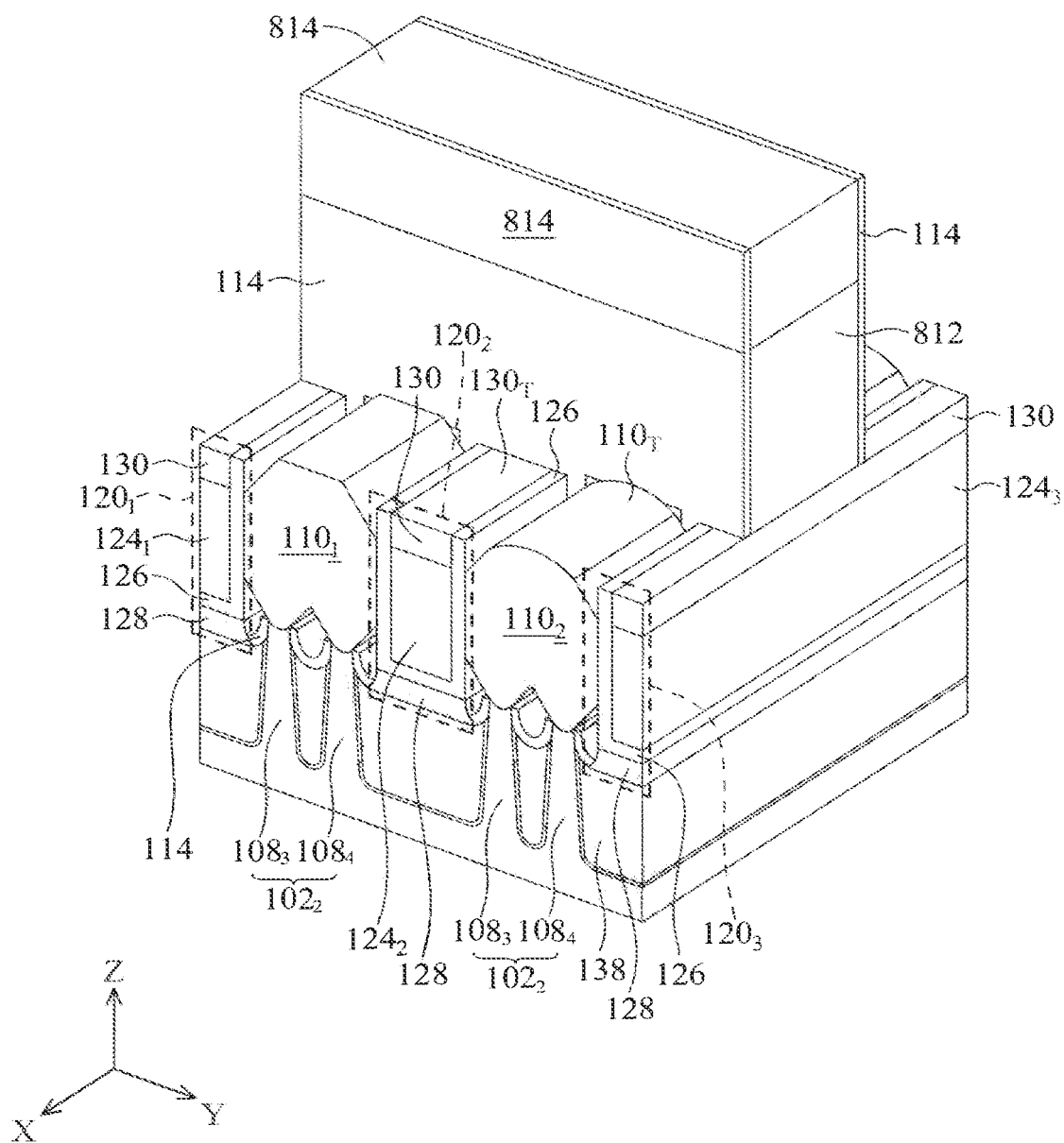

Referring to FIG. 9, the formation of gate spacers 114 can include blanket depositing a layer of an insulating material (e.g., an oxide or a nitride material) over the structure of FIG. 8 (e.g., over fin structures 108 and polysilicon structures 812) by a CVD, a PVD, or an ALD process followed by an etching process (e.g., reactive ion etching or other dry etching process using a chlorine or fluorine based etchant). In some embodiments, gate spacers 114 can have a horizontal (e.g., in the x-direction) thickness ranging from about 3 nm to about 10 nm.

The formation of epitaxial fin region 110 can include (i) etching back portions of fin structures 108 not covered by polysilicon structures 812 and gate spacers 114, and (ii) growing epitaxial fin region 110 (e.g., epitaxial fin regions $110_1$ and $110_2$) over the etched fin structures 108 not covered by polysilicon structures 812 and gate spacers 114. During the etching back process, polysilicon structures 812 can be protected from being etched by hard mask layer 844 and gate spacers 114. Further, during the etching back process, conductive rail structure 120 can be protected from being etched by capping layer 130 and insulating liner 126. In some embodiments, the etching back of fin structures 108 can be performed by a biased etching process to remove stacked fin portion 108B of the fin structure 108. In some embodiments, the etching back of fin structure 108 can expose portions of fin base portion 108A of the fin structure 108. In some embodiments, the etching back of fin structure 108 can expose portions of fin structure 108 (e.g., stacked fin portion 108B) under polysilicon structure 812. By way of example and not limitation, the bias etching process can be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases.

The etching back process can be followed by the growing one or more epitaxial semiconductor materials on the exposed portions of fin structures 108. In some embodiments, the exposed portions of fin structures 108 can include (i) fin base portion 108A not covered by polysilicon structures 812 and gate spacers 114, and (ii) stacked fin portion 108B under polysilicon structure 812. In some embodiments, the exposed portions of fin structures 108 can be defined by a masking layer (not shown in FIG. 9) patterned by a lithography process. Accordingly, fin epitaxial regions 110 for different FETs 102 can be different from each other. For example, fin epitaxial regions $110_1$ for FET $102_1$ can have different material and/or doping as fin epitaxial region $110_2$ for FET $102_2$. As shown in FIG. 9, fin epitaxial regions 110 for FETs 102 can be horizontally (e.g., in the y-direction) confined by conductor rail structures 120. Accordingly, conductor rail structure 120 can prevent the merging of fin epitaxial regions 110 from two adjacent FETs 102. In some embodiments, each FET 102 can have a substantially identical separation between its outmost fin structures 108 and its adjacent conductor rail structures 120. For example, the separation of each FET 102 and outmost fin structure 108 can be substantially identical to $t_{428}$ shown in FIG. 7. Therefore, the volume of fin epitaxial region 110 of each FET 102 can be directly determined by the number of fin structures 108 under fin epitaxial region. For example, fin epitaxial region $110_1$ for FET $102_1$ and fin epitaxial region $110_2$ for FET $102_2$ can have substantially identical volume with each other, where FETs $102_1$ and $102_2$ can have identical numbers of fin structures 108 with each other.

The one or more epitaxial semiconductor material for epitaxial fin regions 110 can each have a lattice constant substantially close to that of the material of fin structure 108 and/or substrate 106 (e.g., lattice mismatch about 5%). In some embodiments, the one or more epitaxial semiconductor material for epitaxial fin regions 110 can be the same material as substrate 106, fin base portion 108A, and/or stacked fin portion 108B. In some embodiments, the one or more epitaxial semiconductor material for epitaxial fin regions 110 can include: (i) a semiconductor material, such as Ge and Si; (ii) a compound semiconductor material, such as GaAs and/or AlGaAs; or (iii) a semiconductor alloy, such as SiGe and/or GaAsP. In some embodiments, S/D regions 110 can be grown by (i) CVD, such as LPCVD, ALCVD, UHVCVD, RPCVD, and any other suitable CVD; (ii) MBE process; (iii) any suitable epitaxial process; or (iv) a combination thereof. In some embodiments, epitaxial fin regions 110 can be grown by an epitaxial deposition/partial etch process, which can repeat the epitaxial deposition/partial etch process at least once. Such repeated deposition/partial etch process is also called a cyclic deposition-etch (CDE) process. Epitaxial fin regions 110 can be doped as p-type or n-type. In some embodiments, p-type epitaxial fin region 110 can include SiGe and can be in-situ doped during an epitaxial growth process using p-type doping precursors, such as $B_2H_6$, $BF_3$, and other p-type doping precursors. In some embodiments, n-type epitaxial fin region 110 can include Si and can be in-situ doped during an epitaxial growth process using n-type doping precursors such as $PH_3$, $AsH_3$, and other n-type doping precursors. Other materials and dopant concentrations for the plurality of n-type and/or p-type sub-regions are within the scope and spirit of this disclosure.

Referring to FIG. 2, in operation 220, the sacrificial gate structure is replaced with a metal gate structure. For example, as shown in FIG. 12, gate electrode 112C (e.g., gate structure 112) can be formed on fin structures 108 and conductive rail structures 120 as described in reference to FIGS. 11 and 12. The replacing of polysilicon structure 812 with gate structure 112 can include (i) forming ESL 116 and ILD layer 118 over the structure of FIG. 10 (shown in FIG. 11), (ii) removing polysilicon structure 812 to form a recess structure between epitaxial fin regions 110 (not shown in FIGS. 11 and 12), and (iii) forming gate structure 112 in the recess structure between epitaxial fin regions 110 (shown in FIG. 12).

Figure 11:
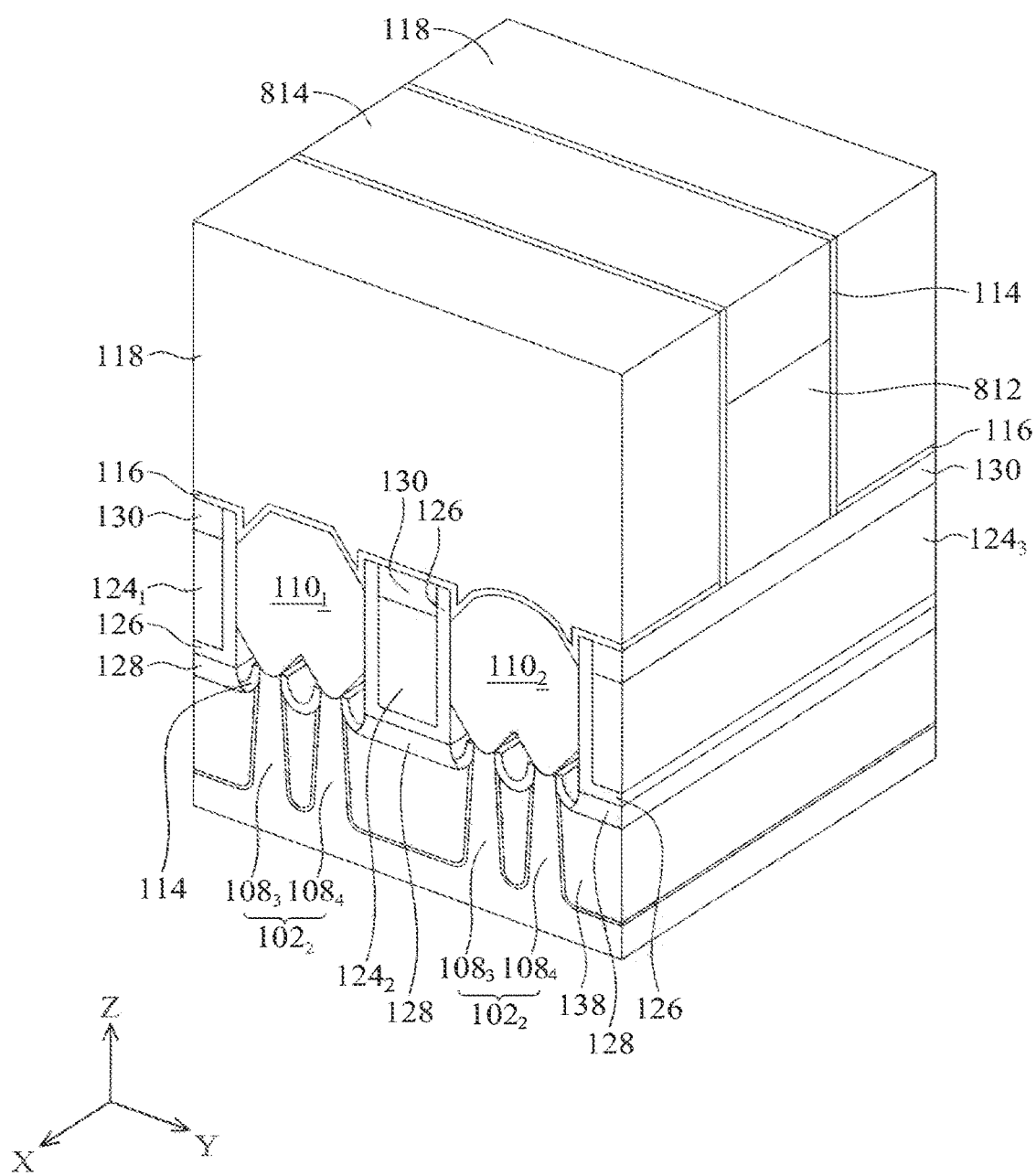
Figure 12:
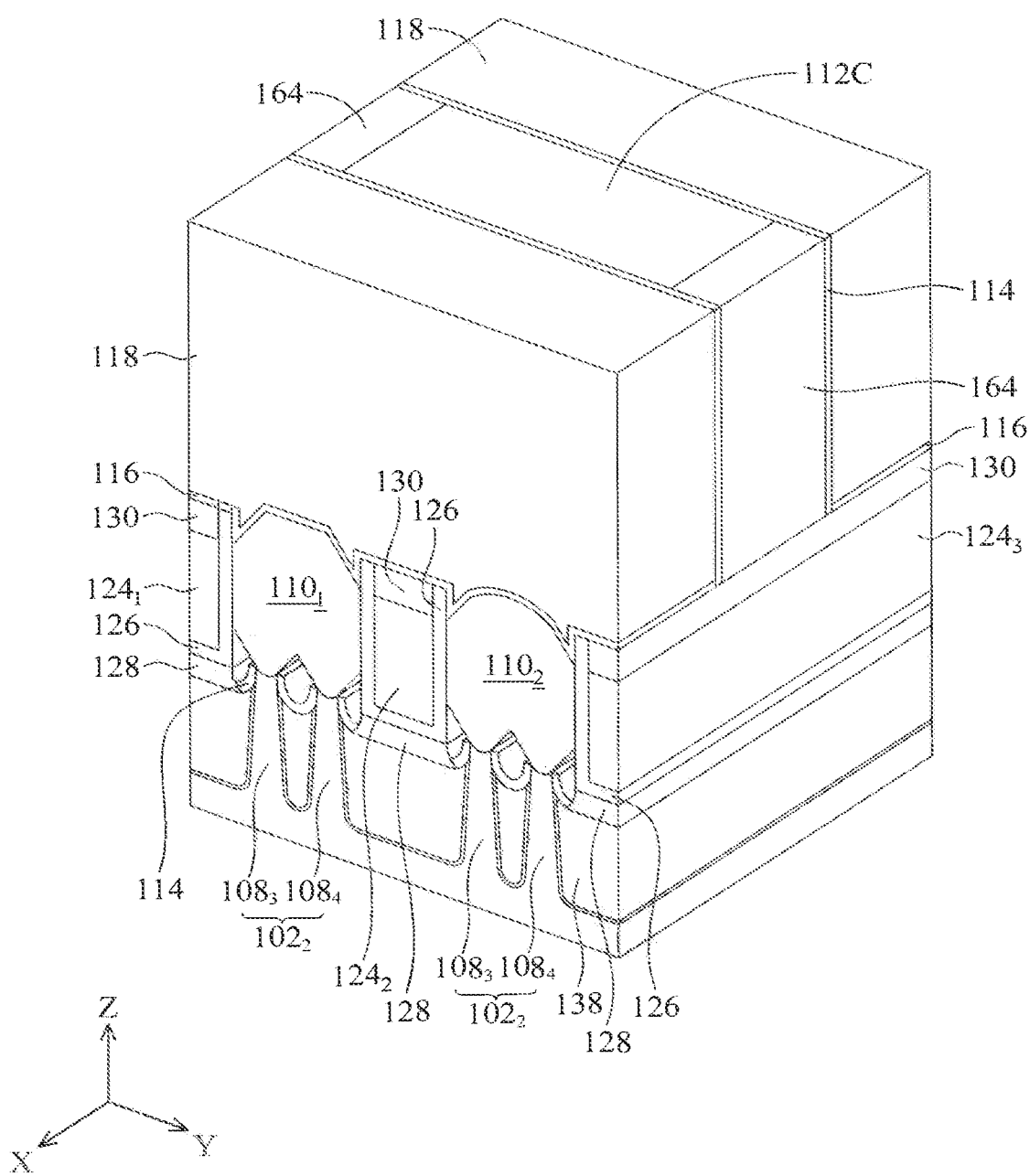

Referring to FIG. 11, the formation of ESL 116 can include blanket depositing a layer of material for ESL 116 on the structure of FIG. 10 by any suitable deposition method, such as PECVD, SACVD, LPCVD, ALD, high-density plasma (HDP), plasma enhanced atomic layer deposition (PEALD), molecular layer deposition (MLD), and plasma impulse chemical vapor deposition (PICVD). By way of example and not limitation, the layer of material for ESL 116 can include silicon nitride, silicon oxide, SiON, SiC, SiCN, boron nitride (BN), silicon boron nitride (SiBN), silicon carbide boron nitride (SiCBN), or a combination thereof. The blanket deposition of the layer of material for ESL 116 can be followed by a blanket deposition of a layer of dielectric material for ILD layer 118. In some embodiments, the dielectric material can be silicon oxide. The layer of dielectric material can be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using FCVD process. The blanket deposition process can be followed by a thermal annealing of the deposited layer of dielectric material in steam at a temperature ranging from about 200° C. to about 700° C. for a period ranging from about 30 minutes to about 120 minutes. The thermal annealing can be followed by a CMP process to coplanarize top surfaces of ESL 116, ILD layer 118, gate spacers 114, and hard mask layer 814 with each other as shown in FIG. 11. In some embodiments, the CMP process can remove hard mask layer 814 and can coplanarize top surfaces of ESL 116, ILD 118, gate spacers 114, and polysilicon structure 812 with each other.

Following the formation of ESL 116 and/or ILD layer 118, polysilicon structures 812 can be removed to form the recess structure between epitaxial fin regions 110. By way of example and not limitation, a process of removing polysilicon structures 812 can include a dry etching process (e.g., reactive ion etching) or a wet etching process, each having a higher etching rate towards polysilicon structures 812 and a lower etching rate (e.g., selectivity greater than 1) towards fin structures 108, ESL 116, ILD 118, and gate spacers 114. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or potassium hydroxide (KOH) wet etch can be used to remove polysilicon structures 812. The removal of polysilicon structures 812 can therefore form the recess structure to expose side surfaces of gate spacer 114 and portions of fin structures 108 under polysilicon structures 812.

Referring to FIG. 12, the formation of gate structures 112 can include (i) performing an oxidation process to form oxide layer 112A (not shown in FIG. 12) on surfaces of the exposed fin structures 108 (e.g., stacked fin portion 108B) in the recess structure, (ii) depositing dielectric material for gate dielectric layers 112B (not shown in FIG. 12), and (iii) depositing conductive material for gate electrode 112C (shown in FIG. 12). In some embodiments, the formation of gate structure 112 can further include polishing gate electrode 112C to coplanarize gate electrode 112C's top surface with ILD layer 118's top surface via a CMP process. The oxidation process for forming oxide layer 112A can include a thermal oxidation or an ozone based oxidation process performed at a temperature from about 400° C. to about 600° C. for a period from about 2 min to about 4 hrs. In some embodiments, oxide layer 112A can be a transition layer sandwiched between gate dielectric layer 112B and the exposed fin structures 108 (e.g., stacked fin portion 108B) to enhance gate structure 112's channel modulation for FET 102. Gate dielectric layers 112B can include a single layer of insulating material or a stack of insulating materials. In some embodiments, the dielectric material for gate dielectric layers 112B can include (i) a low-k dielectric material, such as silicon oxide, silicon nitride, and silicon oxynitride, (ii) a high-k dielectric material, such as aluminum oxide, hafnium oxide ($HfO_2$), $TiO_2$, HfZrO, $Ta_2O_3$, $HfSiO_4$, $ZrO_2$, and $ZrSiO_2$, (iii) a high-k dielectric material having oxides of lithium (Li), beryllium (Be), magnesium (Mg), calcium (Ca), strontium (Sr), scandium (Sc), yttrium (Y), Zr, Al, lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. In some embodiments, gate dielectric layers 112B can be deposited by CVD, ALD, PVD, e-beam evaporation, or other suitable processes. Gate electrode 112C can include a single metal layer or a stack of metal layers. In some embodiments, gate electrode 112C can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and combinations thereof. Gate electrode 112C can be formed by ALD, PVD, CVD, or other suitable deposition process.

In some embodiments, operation 220 can further include forming an insulating layer to separate gate structure 112 from another gate structure 112. For example, as shown in FIG. 12, insulating layer 164 can be formed to horizontally (e.g., in the y-direction) confine gate structure 112. By way of example and not limitation, the process of forming insulating layer 164 can include (ii) defining a patterned hard mask (not shown in FIG. 12) using a lithography process, (ii) removing gate structure 112 through the patterned hard mask to form a recess structure (not shown in FIG. 12) using a dry etch process, and (iii) filling the recess structure with one or more insulating materials. In some embodiments, the dry etch process can include using a plasma dry etch that can selectively etch gate electrode 112C from ILD layer 118. For example, the plasma dry etch can be conducted using a gas mixture having $C_4F_6$ mixed with HZ or $O_2$ with a pressure ranging from about 1 mTorr to about 100 mTorr and plasma power from about 50 Watts to about 200 Watts.

Referring to FIG. 2, in operation 225, one or more metal contacts are formed over the metal gate structure and the source/drain regions, and an interconnect structure is formed over the metal gate structure and the one or more metal contacts. For example, as shown in FIGS. 15A and 15B, S/D contact 132 can be formed on epitaxial fin regions 110 (e.g., epitaxial fin regions $110_1$ and $110_2$), and interconnect structure 140 can be formed over metal gate structure 112, and S/D contact 132 as described in reference to FIGS. 13A-13C, 14, 15A, and 15B.

Figure 13A:
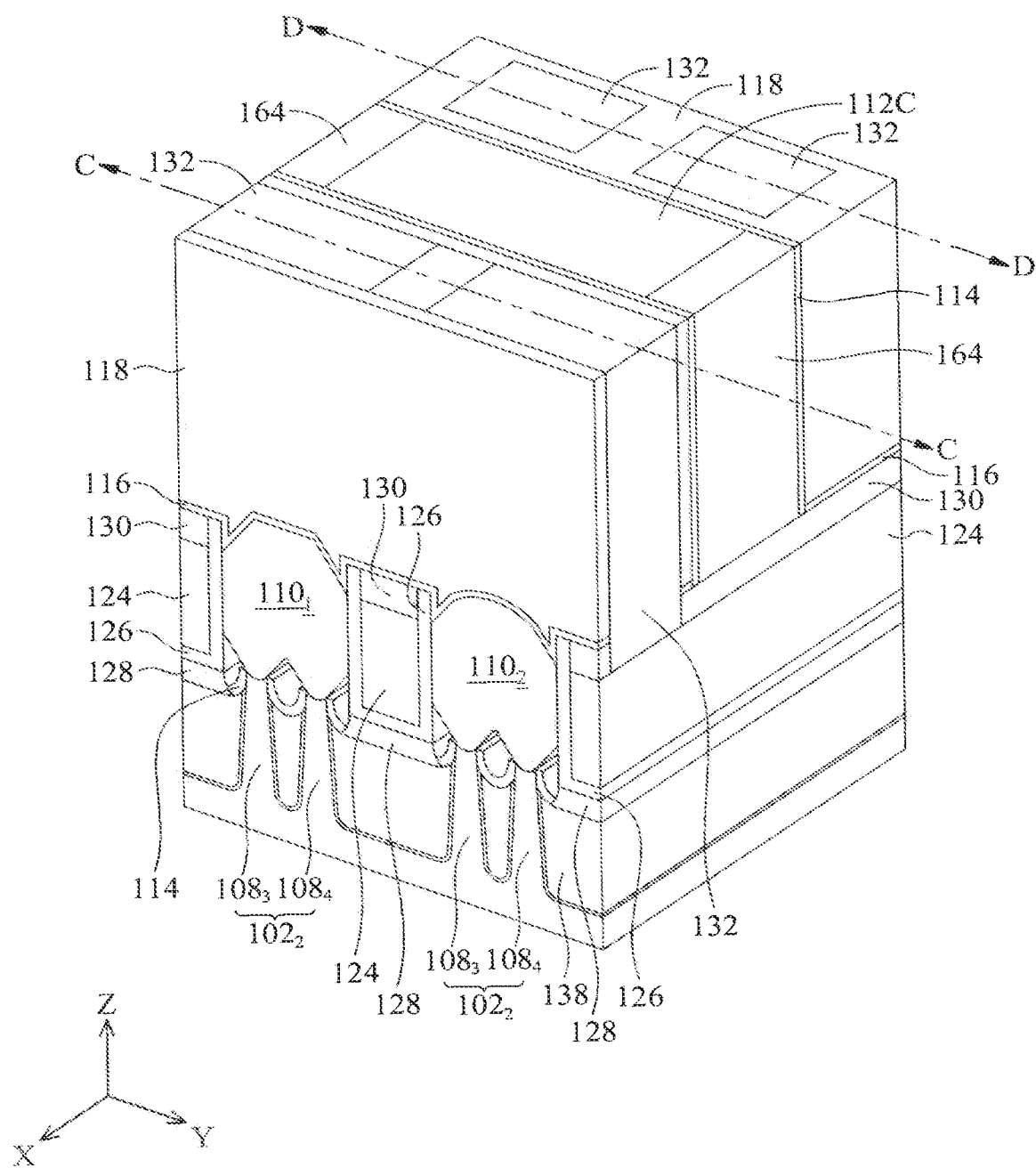
Figure 13B:
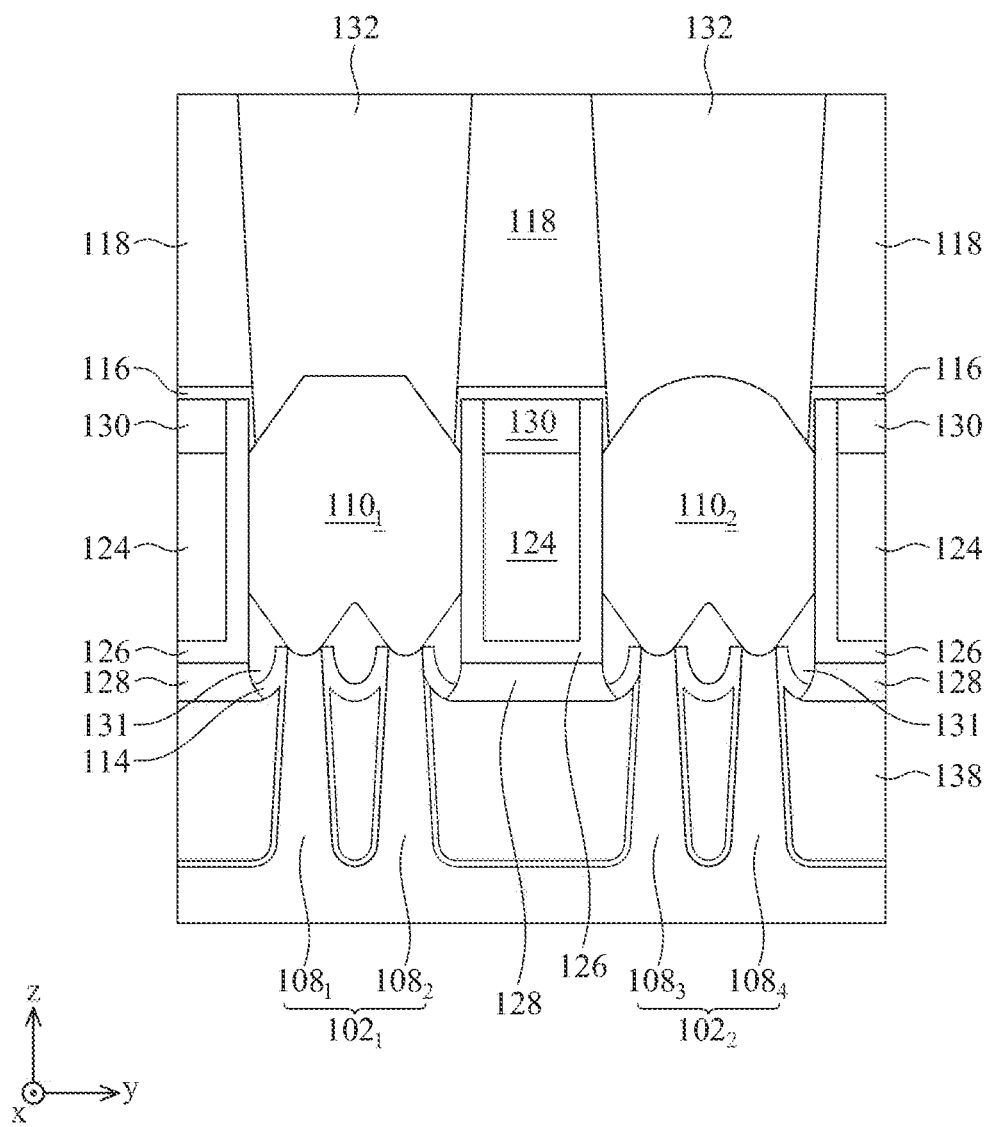
FIGS. 13B and 13C illustrate cross-sectional views of a semiconductor device at various stages of its fabrication process, according to some embodiments.
Figure 13C:
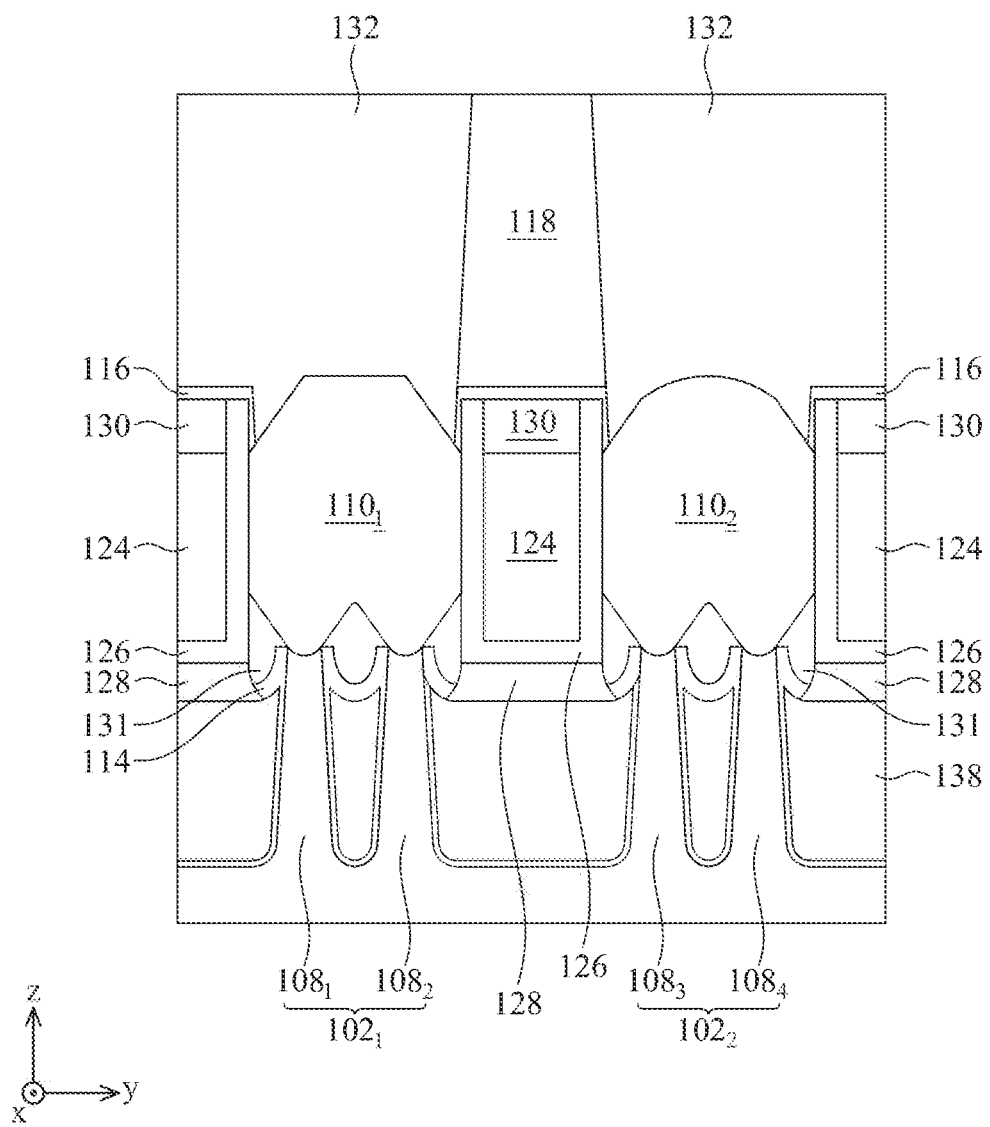

Referring to FIGS. 13A-13C, by way of example and not limitation, a process of forming S/D contact 132 can include (i) forming a patterned mask layer (not shown in FIGS. 13A-13C) to expose a portion of ILD layer 118 above fin epitaxial regions 110 using a lithography process, (ii) removing ILD layer 118 and ESL 116 through the patterned mask layer to form a recess structure (not shown in FIGS. 13A-13C) that exposes fin epitaxial regions 110, (iii) depositing one or more conductive materials in the recess structure using a suitable deposition process (e.g., CVD, ALD, PVD, or e-beam evaporation), and (iv) polishing the deposited one or more conductive materials using a CMP process. By way of example and not limitation, the one or more conductive materials for S/D contact 132 can include a metal silicide, a conductive nitride liner, or a metallic material such as W, Al, Cu, Ti, and Co. Accordingly, as shown in FIG. 13A, the resulting S/D contact 132 can be coplanarized with gate structure 112's gate electrode 112C and ILD layer 118. Further, as shown in FIG. 13B (the cross-sectional view of FIG. 13A's line D-D), the resulting S/D contact 132 can be in contact with its underlying fin epitaxial regions 110. In some embodiments, as shown in FIG. 13C (the cross-sectional view of FIG. 13A's line C-C), the formation of S/D contact 132 can further include removing capping layer 130 through the patterned hard mask layer (not shown in FIGS. 13A-13C) to expose conductor layer 124, and depositing the one or more conductive material to form S/D contact 132 in contact with the conductor layer 124. Accordingly, conductive rail structure 120 can electrically connect to and provide interconnect routing for its adjacent FETs 102.

Figure 14:
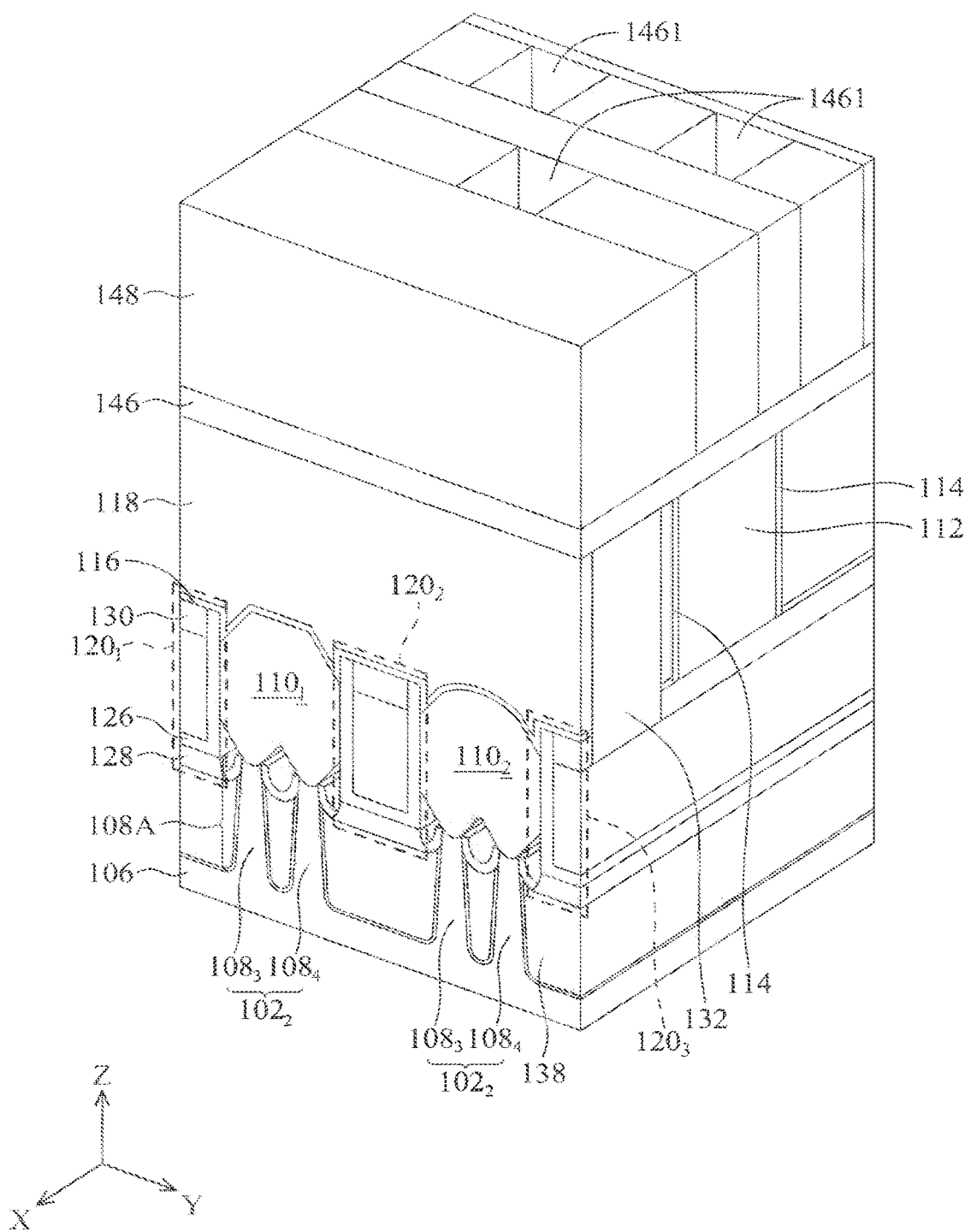
FIGS. 14 and 15A illustrate isometric views of a semiconductor device at various stages of its fabrication process, according to some embodiments.
Figure 15A:
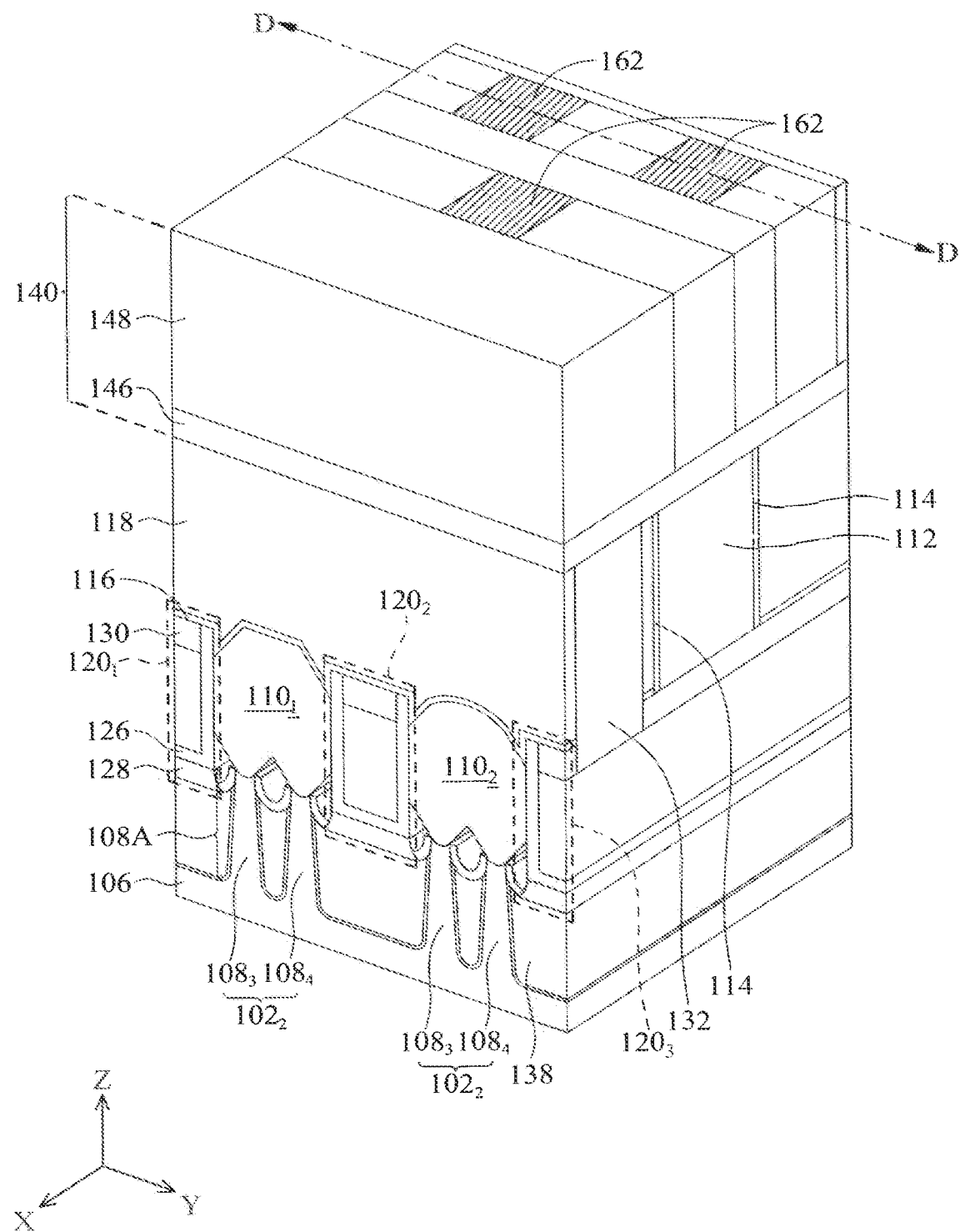
Figure 15B:
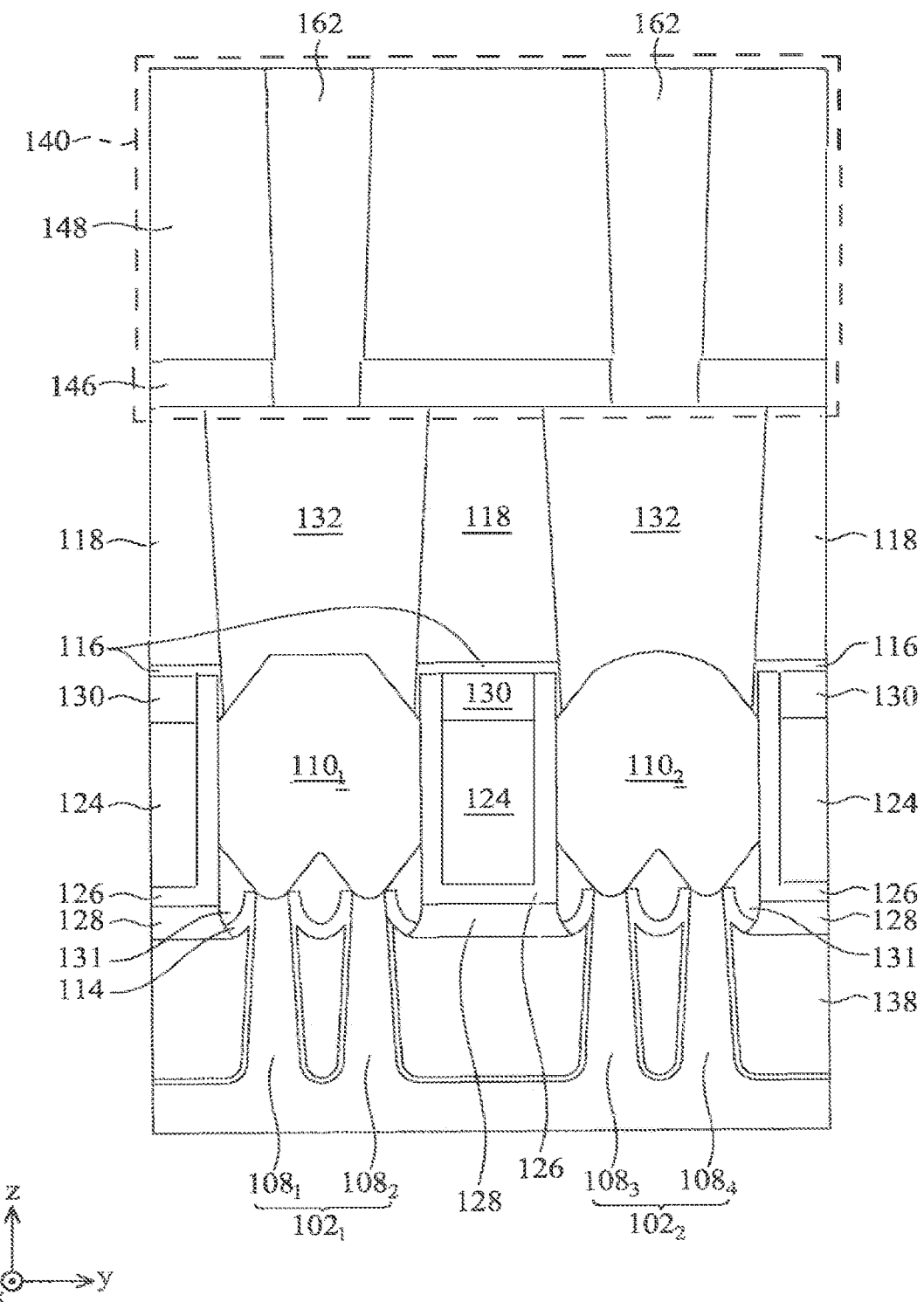
FIG. 15B illustrates a cross-sectional view of a semiconductor device at various stages of its fabrication process, according to some embodiments.

Referring to FIGS. 14, 15A, and 15B, by way of example and not limitation, a process of forming interconnect structure 140 can include (i) blanket depositing ESL 146 and layer of insulating material 148 over the structure of FIG. 13A (e.g., over S/D contact 132, gate electrode 112C, and ILD layer 118) via a suitable deposition process, such as a CVD process, a PECVD process, a PVD process, and a ALD process, (ii) forming one or more vias 1461 (shown in FIG. 14) through ESL 146 and layer of insulating material 148 using a lithography process and an etching process, and (iii) filling the one or more vias 1461 with one or more conductive material to form trench conductor layer 162 (shown in FIG. 15A) using a suitable deposition process (e.g., CVD, ALD, PVD, or e-beam evaporation) and a polishing process (e.g., a CMP process). In some embodiments, as shown in FIG. 15B (the cross-sectional view of FIG. 15A's line C-C), the resulting trench conductor layer 162 can be in contact with S/D contact 132. In some embodiments, the process of forming via 1461 can further include removing ILD layer 118 and ESL 116, such that the resulting trench conductor layer 162 can be in contact with gate electrode 112C. In some embodiments, the process of forming via 1461 can further include removing ILD layer 118, ESL 116, and capping layer 118, such that the resulting trench conductor layer 162 can be in contact with conductor layer 124. In some embodiments, the process of forming interconnect structure 140 can further include depositing a layer of conductive material (not shown in FIGS. 15A and 15B) over trench conductor layer 162 and layer of insulating material 148 using a suitable deposition process (e.g., CVD, ALD, PVD, or e-beam evaporation), where the layer of conductive material can provide an interconnect routing for interconnect structure 140.

The present disclosures provides an exemplary conductive rail structure and a method for forming the same. The conductive rail structure can be laterally placed adjacent to a transistor, where the conductive rail structure can provide an electrical routing for the adjacent transistor. In some embodiments, the conductive rail structure can include one or more insulating layers and a metal rail surrounded by the one or more insulating layers. The metal rail's top surface can be below or substantially coplanar with the adjacent transistor's top surface. A benefit of the conductive rail structure, among others, is to utilize the lateral spacing between transistors for interconnect routing, thus saving layout area for high density integrated circuits.

In some embodiments, a method for forming a semiconductor structure can include forming a fin structure, extending along a first horizontal direction, over a substrate, forming a conductive rail structure, extending along the first horizontal direction, adjacent to the fin structure, and forming a metal gate structure, extending along a second horizontal direction over the fin structure and the conductive rail structure.

In some embodiments, a method for forming a semiconductor structure can include forming a first group of fin structures and a second group of fin structures over a substrate, wherein each of the first and second groups of fin structures extends along a first horizontal direction, forming a conductive rail structure, extending along the first horizontal direction, between the first group of fin structures and the second group of fin structures; and forming a sacrificial gate structure, extending along a second horizontal direction, over the first group of fin structures, the second group of fin structures, and the conductive rail structure.

In some embodiments, a semiconductor structure can include a substrate, a first vertical structure and a second vertical structure formed over the substrate, and a conductive rail structure between the first and second vertical structures, wherein a top surface of the conductive rail structure is substantially coplanar with top surfaces of the first and the second vertical structures.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming two adjacent fin structures on a substrate separated by a shallow trench isolation region;
    forming a conductive rail structure on the substrate; and
    forming an epitaxial region on each of the two adjacent the fin structures and in contact with the conductive rail structure, wherein an entire sidewall of the epitaxial region in a plane perpendicular to the substrate is in contact with the conductive rail structure.

2. The method of claim 1, further comprising forming a top surface of the conductive rail structure substantially coplanar with a top surface of the epitaxial region.

3. The method of claim 1, further comprising forming a void structure surrounded by the conductive rail structure, the epitaxial region, and one of the two adjacent fin structures.

4. The method of claim 1, wherein forming the conductive rail structure comprises:
    forming a padding layer on the shallow trench isolation region and on the sidewalls of the two adjacent fin structures;
    forming an insulating liner over the padding layer and sidewalls of the padding layer;
    forming a conducting layer on the padding layer; and
    forming a capping layer over the conducting layer.

5. The method of claim 4, wherein forming the conducting layer comprises etching back the conducting layer using a dry etching process, a wet etching process, or a combination thereof.

6. The method of claim 4, further comprising forming a top surface of the capping layer and a top surface of the insulating liner substantially coplanar with top surfaces of the two adjacent fin structures.

7. The method of claim 4, further comprising recessing the padding layer to expose the sidewalls of the two adjacent fin structures.

8. The method of claim 7, wherein recessing the padding layer comprises forming a slanted sidewall of the padding layer.

9. A method, comprising:
    forming a first fin structure and a second fin structure over a substrate, wherein each of the first and second fin structures extends along a first horizontal direction;
    forming a first epitaxial region on the first fin structure and a second epitaxial region on the second fin structure;
    forming a conductive rail structure, extending along the first horizontal direction, between the first and second epitaxial regions and in contact with an entire sidewall surface of the first epitaxial region and an entire sidewall surface of the second epitaxial region in a plane perpendicular to the substrate; and forming a sacrificial gate structure, extending along a second horizontal direction, over the first and second fin structures and the conductive rail structure.

10. The method of claim 9, wherein forming the sacrificial gate structure comprises:

forming a polysilicon structure over the first fin structure, the second fin structure, and the conductive rail structure; and forming gate spacers on sidewall surfaces of the polysilicon structure.

11. The method of claim 9, wherein forming the first and second epitaxial regions comprises:

etching back a portion of the first and second fin structures not covered by the sacrificial gate structure; and growing an epitaxial fin region over the etched portion.

12. The method of claim 9, wherein forming the conductive rail structure comprises:

forming a first insulating layer on the substrate;

forming a second insulating layer on the first insulating layer;

forming a conductive layer on a bottom surface and a sidewall of the second insulating layer; and forming a capping layer on the conductive layer.

13. The method of claim 12, further comprising forming the first insulating layer with a thickness less than a separation between the first fin structure and the second fin structure.

14. The method of claim 12, further comprising recessing the first insulating layer to create a first void structure surrounded by the conductive rail structure, the first epitaxial region, and the first fin structure, and to create a second void structure surrounded by the conductive rail structure, the second epitaxial region, and the second fin structure.

15. The method of claim 12, further comprising forming an etch stop layer on the capping layer.

16. A method, comprising:

forming a fin structure disposed on a substrate;

forming an isolation structure disposed on the substrate and adjacent to the fin structure;

forming a conductive rail structure, wherein:

a first insulating layer is disposed on the isolation structure, a second insulating layer is disposed on the first insulating layer, a conductive layer is disposed on a bottom surface and a first sidewall of the second insulating layer, and a capping layer is disposed on and in contact with the conductive layer;

forming an epitaxial region disposed on a first portion of the fin structure and in contact with a second sidewall of the second insulating layer;

forming a gate structure disposed over the conductive rail structure and a second portion of the fin structure; and forming an interconnect structure electrically coupled to the conductive rail structure.

17. The method of claim 16, further comprising recessing the first insulating layer to expose the sidewalls of the fin structure and form slanted sidewalls of the first insulating layer.

18. The method of claim 17, further comprising depositing a gate spacer material on the slanted sidewalls of the first insulating layer.

19. The method of claim 16, wherein forming the conductive rail structure comprises forming a top surface of the conductive rail structure substantially coplanar with a top surface of the epitaxial region.

20. The method of claim 16, further comprising:

forming an etch stop layer on the capping layer; and forming an inter-layer dielectric layer on the etch stop layer.

* * * * *

UNITED STATES PATENT AND TRADEMARK OFFICE
CERTIFICATE OF CORRECTION

| | |
|---|---|
| PATENT NO. | : 12,211,790 B2 |
| APPLICATION NO. | : 18/447664 |
| DATED | : January 28, 2025 |
| INVENTOR(S) | : Liao et al. |

Page 1 of 1

It is certified that error appears in the above-identified patent and that said Letters Patent is hereby corrected as shown below:

On the Title Page

Item [60], under "Related U.S. Application Data", delete "60" and insert -- 63 --, therefor.

Signed and Sealed this
Twentieth Day of May, 2025

Coke Morgan Stewart
*Acting Director of the United States Patent and Trademark Office*